(12) United States Patent
Ichishima et al.

(10) Patent No.: US 9,322,886 B2
(45) Date of Patent: Apr. 26, 2016

(54) ANALYZER

(71) Applicant: Sumitomo Heavy Industries, Ltd., Tokyo (JP)

(72) Inventors: Daiji Ichishima, Kanagawa (JP); Shuji Miyazaki, Kanagawa (JP)

(73) Assignee: SUMITOMO HEAVY INDUSTRIES, LTD., Tokyo (JP)

( * ) Notice: Subject to any disclaimer, the term of this patent is extended or adjusted under 35 U.S.C. 154(b) by 494 days.

(21) Appl. No.: 13/782,662

(22) Filed: Mar. 1, 2013

(65) Prior Publication Data

US 2013/0231879 A1 Sep. 5, 2013

(30) Foreign Application Priority Data

Mar. 2, 2012 (JP) ................................. 2012-046390

(51) Int. Cl.
*G01R 33/00* (2006.01)
*G06F 17/50* (2006.01)

(52) U.S. Cl.
CPC ............ *G01R 33/00* (2013.01); *G06F 17/5009* (2013.01)

(58) Field of Classification Search
CPC ............... G01R 33/00; G01R 33/0023; G01R 33/0064; G06F 17/5009; G01N 27/72
See application file for complete search history.

(56) References Cited

U.S. PATENT DOCUMENTS

2015/0127283 A1* 5/2015 Miyazaki et al. ............... 702/65

FOREIGN PATENT DOCUMENTS

| JP | 11-146688 A | 5/1999 |
| JP | 2009-037334 A | 2/2009 |
| JP | 2011-254678 A | 12/2011 |

OTHER PUBLICATIONS

Claudio Scherer, Stochastic Molecular Dynamics of Colloidal Particles, Jun. 2004, Brazilian Journal of Physics, vol. 34, No. 2A, pp. 442-447.*
Patent Abstract for Japanese Publication No. 11-146688 published May 28, 1999 (1 page).
Patent Abstract for Japanese Publication No. 2009-037334 published Feb. 19, 2009 (1 page).
Bitzek et al., "Structural Relaxation Made Simple," Physical Review Letters, The American Physical Society, Oct. 27, 2006 (4 pages).
Miyazaki et al., "Magnetic Field Analysis by Equation of Motion for Magnetic Field," IEE Japan, (SA . RM), Sep. 29, 2010, SA-10-92 (RM-10-101), pp. 1-5.
Office Action issued on Jul. 7, 2015, by the Japanese Patent Office in corresponding Japanese Patent Application No. 2012-046390. (2 pages).

* cited by examiner

*Primary Examiner* — Toan Le
(74) *Attorney, Agent, or Firm* — Buchanan Ingersoll & Rooney PC

(57) ABSTRACT

An analyzer comprises a particle system acquisition unit operative to acquire information on a particle system defined in a virtual space; a magnetic moment association unit operative to associate a particle in the particle system with a magnetic moment; a numerical operation unit operative to perform numerical operation according to a governing equation that governs a motion of each particle in the particle system, the particle system including the particle which is associated with the magnetic moment by the magnetic moment association unit; and a magnetic field calculation unit operative to calculate a magnetic field created by the particle system using the results of the numerical operation performed by the numerical operation unit.

8 Claims, 12 Drawing Sheets

FIG.2

| PARTICLE ID | POSITION | VELOCITY | MAGNETIC MOMENT |
|---|---|---|---|
| 1 | (10,20,30) | (10,10,0) | (1,1,0) |
| 2 | (11,22,32) | (2,3,1) | (1,1,0) |
| 3 | (31,42,50) | (5,15,2) | (1,0,1) |
|  |  |  |  |

114

ANALYZER

BACKGROUND

1. Technical Field

The present invention relates to an analyzer that analyzes a particle system.

2. Description of Related Art

Recent years, along with the increase of computational capability of a computer, simulations that incorporate analysis of magnetic fields are frequently used in design/development of electric appliances such as a motor. The use of the simulations can increase the speed of the design/development since the simulations enables certain level of evaluations to be performed without actually making prototypes.

For example, an analyzer for a motor is known. The analyzer comprises an arithmetic processing unit that performs analysis of magnetic fields. The arithmetic processing unit, in response to external instructions based on user operations, performs torque calculations according to analysis of static magnetic fields by a Finite Element Method (FEM) or according to a Maxwell stress method. So-called meshing is performed in the analysis of static magnetic fields by the FEM. The meshing is applied to a core region and a housing region, as well as a external air layer region. Other methods for analyzing magnetic fields include a difference method and a magnetic moment method.

SUMMARY

An embodiment of the present invention relates to an analyzer. This analyzer comprises: a magnetic moment association unit operative to associate a particle in a particle system defined in a virtual space with a magnetic moment; a numerical operation unit operative to perform numerical operation according to a governing equation that governs a motion of each particle in the particle system, the particle system including the particle which is associated with the magnetic moment by the magnetic moment association unit; and a magnetic physical quantity calculation unit operative to calculate a magnetic physical quantity with regard to the particle system using the results of the numerical operation performed by the numerical operation unit.

BRIEF DESCRIPTION OF THE DRAWINGS

Embodiments will now be described, by way of example only, with reference to the accompanying drawings, which are meant to be exemplary, not limiting, and wherein like elements are numbered alike in several figures, in which:

FIG. 2 is a data structure diagram showing an example of a particle data storing unit of FIG. 1;

DETAILED DESCRIPTION

Figure 1:
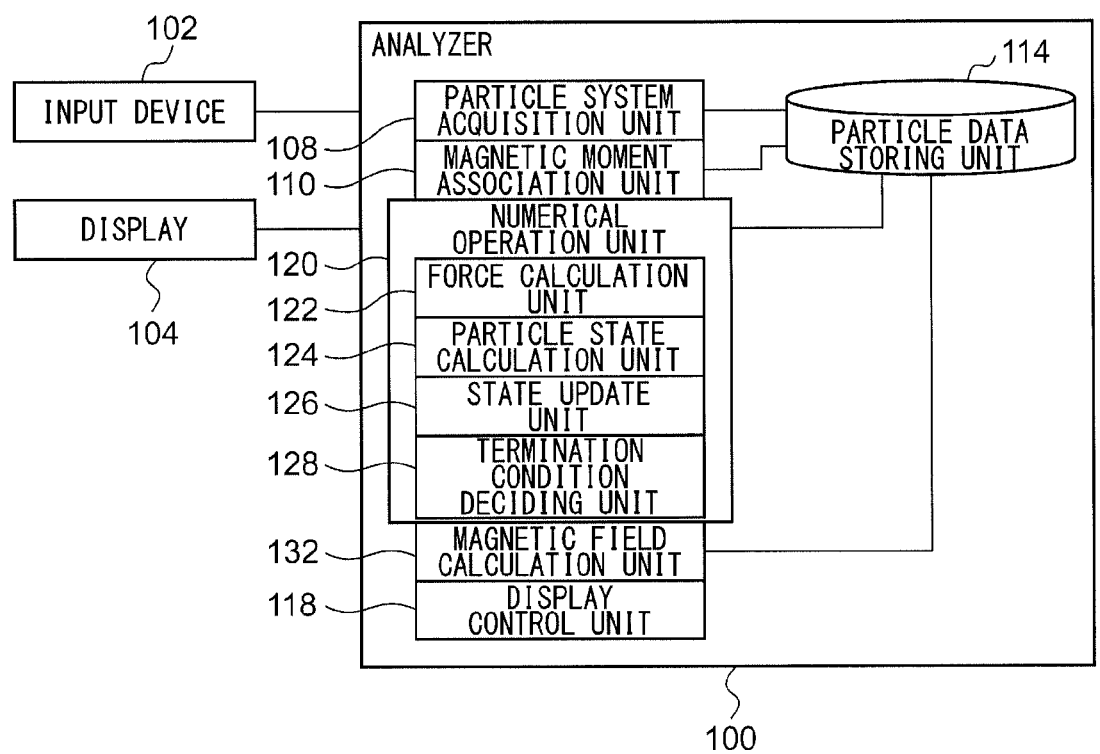
FIG. 1 is a block diagram showing functions or configurations of an analyzer according to an embodiment.

The invention will now be described by reference to the preferred embodiments. This does not intend to limit the scope of the present invention but to exemplify the invention. The size of the component in each figure may be changed in order to aid understanding. Some of the components in each figure may be omitted if they are not important for explanation.

In the prior art methods, the meshing is applied to the object to be analyzed. However, if the object to be analyzed is fluid and if a fixed mesh is used with moving boundaries, the analysis may become difficult. If the object to be analyzed performs large displacement of a magnetic body or a plastic body, the meshing may be difficult. In particular in the case where the meshing is performed in the magnetic field analysis including a rotor such as a motor, polymerization of meshes (if the polymerization is single, this is the large displacement) makes the analysis difficult.

One of the purposes of the present invention is to provide an analysis technique that enables a preferred analysis of magnetic phenomena in simulations.

As to methods for analyzing phenomena of general material science using computers based on classical mechanics or quantum mechanics, simulations based on a Molecular Dynamics Method (hereinafter referred to as "MD method"), a Quantum Molecular Dynamics Method or a Renormalized Molecular Dynamics (hereinafter referred to as "RMD method") are known. The RMD method is a developed version of the MD method so that it can be applied to macroscale systems. To be precise, the MD method/the RMD method which are kinetics methods (calculations of physical quantity uses statistical mechanics) and the particle method in which a differential equation describing a continuum is discretized are different. However, in this specification, the MD method/the RMD method are referred to as the particle method.

Since the particle method can analyze not only static phenomena but also dynamic phenomena such as flow, the particle method attracts attention as a simulation method replacing the above-mentioned FEM in which the object to be analyzed mainly is a static phenomenon.

From a differential point of view, the particle method obtains a particle system to be analyzed by discretizing a continuum by particles. For example, when fluid is analyzed by the particle method, it is often the case that the Navier-Stokes equation is discretized by particles.

From another or integral point of view, the particle method forms a continuum by collecting many particles. This is, for example, a view in which a large iron ball is formed by collecting and solidifying small iron particles.

In general, when one calculates a magnetic field at a certain point in a space where many magnetic moments exist, due to superposition principle, one will sum up the magnetic field at the certain point created by each magnetic moment over the many magnetic moments. The present inventors recognize affinity between the method for calculating the magnetic field from such a collection of magnetic moments and the particle method in the integral view, and devise the idea of associating a magnetic moment with a particle in the particle method. By doing so, it is possible to broaden the cover range of the particle method to magnetic field analyses while maintaining the advantage of the particle method, the advantage being that the particle method is effective for analyses of convection or large displacement.

FIG. 1 is a block diagram showing functions or configurations of an analyzer 100 according to an embodiment. It should be understood that each block depicted in the Figure can be realized with hardware. Such hardware includes an electronic device (s) or an element (s) such as a CPU (Central Processing Unit) of a computer. It should also be understood that each block depicted in the Figure can be realized by software. Such software includes a computer program. In the Figure in particular, the depicted functional block is realized by cooperation of these elements. Therefore, it should be understood by a person skilled in the art who has read this specification that it is possible to realize these functional blocks in various forms by hardware, software or a combination of those.

In the present embodiment, a particle system is analyzed based on the RMD method. However, it will be obvious to a person skilled in the art who has read this specification that a technical concept according to the present embodiment can be applied to the case where the particle system is analyzed based on other particle method such as the MD method, the Distinct Element Method, the Smoothed Particle Hydrodynamics, or the Moving Particle Semi-implicit.

The analyzer 100 is connected to an input device 102 and a display 104. The input device 102 may be a keyboard or a mouse for receiving user inputs that are related to processes performed in the analyzer 100. The input device 102 may be configured to receive inputs from a storage medium such as networks (Internet), CD or DVD.

The analyzer 100 comprises a particle system acquisition unit 108, a magnetic moment association unit 110, a numerical operation unit 120, a magnetic field calculation unit 132, a display control unit 118 and a particle data storing unit 114.

The particle system acquisition unit 108 is operative to acquire data of a particle system. The particle system comprises N (N is a natural number) particles. Those N particles are defined in a one, two or three dimensional virtual space, based on input information acquired from a user through the input device 102. The particle system is a particle system which is renormalized using the RMD method.

The particle system acquisition unit 108 is operative to arrange N particles in the virtual space based on the input information and to associate a velocity with each arranged particle. The particle system acquisition unit 108 is operative to associate a particle ID identifying an arranged particle and a position of the associated particle and a velocity of the arranged particle and to register the associated information to the particle data storing unit 114.

The magnetic moment association unit 110 is operative to associate, based on input information obtained from a user through the input devise 102, a magnetic moment with a particle of the particle system acquired by the particle system acquisition unit 108. For example, the magnetic moment association unit 110 is operative to require, of the user, inputs for magnetic moments of particles of the particle system through the display 104. The magnetic moment association unit 110 is operative to associate the input magnetic moment and the particle ID and to register the associated information to the particle data storing unit 114.

The following descriptions assume that all particles of the particle system are homogeneous or equivalent. The following descriptions also assume that a potential energy function is based on pair potential and has the same form regardless of particles. However, it will be obvious to a person skilled in the art who has read this specification that a technical concept according to the present embodiment can be applied to other cases.

The numerical operation unit 120 is operative to perform numerical operation according to a governing equation that governs a motion of each particle in the particle system, the particle system being represented by data stored by the particle data storing unit 114. In particular, the numerical operation unit 120 is operative to perform repeated operation according to an equation of motion of a discretized particle. The equation of motion of the particle has a term dependent on the magnetic moment. The numerical operation unit 120 includes a force calculation unit 122, a particle state calculation unit 124, a state update unit 126 and a termination condition deciding unit 128.

The force calculation unit 122 is operative to refer data of the particle system stored by the particle data storing unit 114 and to calculate a force applied to each particle in the particle system based on particle-particle distances. The force applied to a particle includes a force based on interaction (s) between magnetic moments. The force calculation unit 122 is operative to, with regard to i-th (i is greater than or equal to 1 and i is less than or equal to N) particle in the particle system, identify particle (s) whose distance from the i-th particle is less than a predetermined cut-off distance. Hereinafter, such identified particles are called neighboring particles.

The force calculation unit 122 is operative to calculate a force applied to the i-th particle by each neighboring particle based on the potential energy function between the neighboring particle and the i-th particle and the distance between the neighboring particle and the i-th particle. In particular, the force calculation unit 122 is operative to calculate the force by obtaining a value of a gradient of the potential energy function at the value of the distance between the neighboring particle and the i-th particle. The force calculation unit 122 is operative to sum up the force applied to the i-th particle by a neighboring particle over all neighboring particle in order to calculate the total force applied to the i-th particle.

The particle state calculation unit 124 is operative (i) to refer data of the particle system stored by the particle data storing unit 114 and (ii) to apply the total force calculated by the force calculation unit 122 to the discretized equation of motion of each particle in the particle system and (iii) to calculate, based on the results of the application, at least one of the position and the velocity of the each particle. In this embodiment, the particle state calculation unit 124 is operative to calculate both the position and the velocity of a particle.

The particle state calculation unit 124 is operative to calculate the velocity of a particle according to the discretized equation of motion of the particle, the equation including the force calculated by the force calculation unit 122. The particle state calculation unit 124 is operative to calculate the velocity of the i-th particle of the particle system by substituting the force calculated for the i-th particle by the force calculation unit 122 for the discretized equation of motion of the i-th particle, the equation being discretized based on a certain numerical analysis method such as leapfrog method or Euler method and the equation being discretized using a certain minute ticks of time $\Delta t$. This calculation uses velocities of the particle obtained in the previous cycle of the repeated operation.

The particle state calculation unit 124 is operative to calculate the position of a particle based on the calculated velocity of the particle. The particle state calculation unit 124 is operative to calculate the position of the i-th particle of the particle system by applying the calculated velocity of the i-th particle to an equation of relationship between the position and the velocity of the i-th particle, the equation being discretized based on a certain numerical analysis method and the equation being discretized using the ticks of time Δt. This calculation uses positions of the particle obtained in the previous cycle of the repeated operation.

The state update unit 126 is operative to update each of the position and the velocity of each particle in the particle system stored by the particle data storing unit 114 with the position and the velocity calculated by the particle state calculation unit 124.

The termination condition deciding unit 128 is operative to decide whether the repeated operation in the numerical operation unit 120 should be terminated or not. The termination conditions with which the repeated operation should be terminated may include the condition that the number of operations in the repeated operation reaches a predetermined number, the condition that an instruction for termination is received from outside and the condition that the particle system reaches a steady state. The termination condition deciding unit 128 is operative to terminate the repeated operation in the numerical operation unit 120 if the termination condition is met. The termination condition deciding unit 128 is operative to return the process to the force calculation unit 122 if the termination condition is not met. Then, the force calculation unit 122 is operative to again calculate the force with positions of particles updated by the state update unit 126.

The magnetic field calculation unit 132 is operative to, after the termination of the operation in the numerical operation unit 120, calculate the magnetic field created by the particle system, the particle system being represented by data stored by the particle data storing unit 114. The magnetic field calculation unit 132 is operative to calculate the magnetic field based on a magnetic moment of each particle stored by the particle data storing unit 114. The magnetic field is a magnetic physical quantity related to the particle system. The magnetic field calculation unit 132 may be operative to calculate a magnetic flux density or a magnetization in addition to or in substitution for the magnetic field. The magnetic field calculation unit 132 may be operative to calculate the magnetic field created at a position of a particle for each step of the repeated operation in the numerical operation unit 120.

The display control unit 118 is operative to cause the display 104 to display the time evolution of the particle system or the state of the particle system at a certain time based on the position, velocity and magnetic moment of each particle of the particle system, the particle system being represented by data stored by the particle data storing unit 114. This display may be performed in a form of still image or moving image.

FIG. 2 is a data structure diagram showing an example of a particle data storing unit 114. The particle data storing unit 114 stores the particle ID, the position of the particle, the velocity of the particle and the magnetic moment of the particle.

In the above-described embodiment, an example of the storing unit is a hard disk or a memory. It should be understood by a person skilled in the art who has read this specification that it is possible to realize each unit, based on descriptions in this specification, by a CPU (not shown), a module of installed application program, a module of system program or a memory temporarily storing contents of data that has been read out from a hard disk.

The operation of the analyzer 100 as described above shall be described below.

Figure 3:
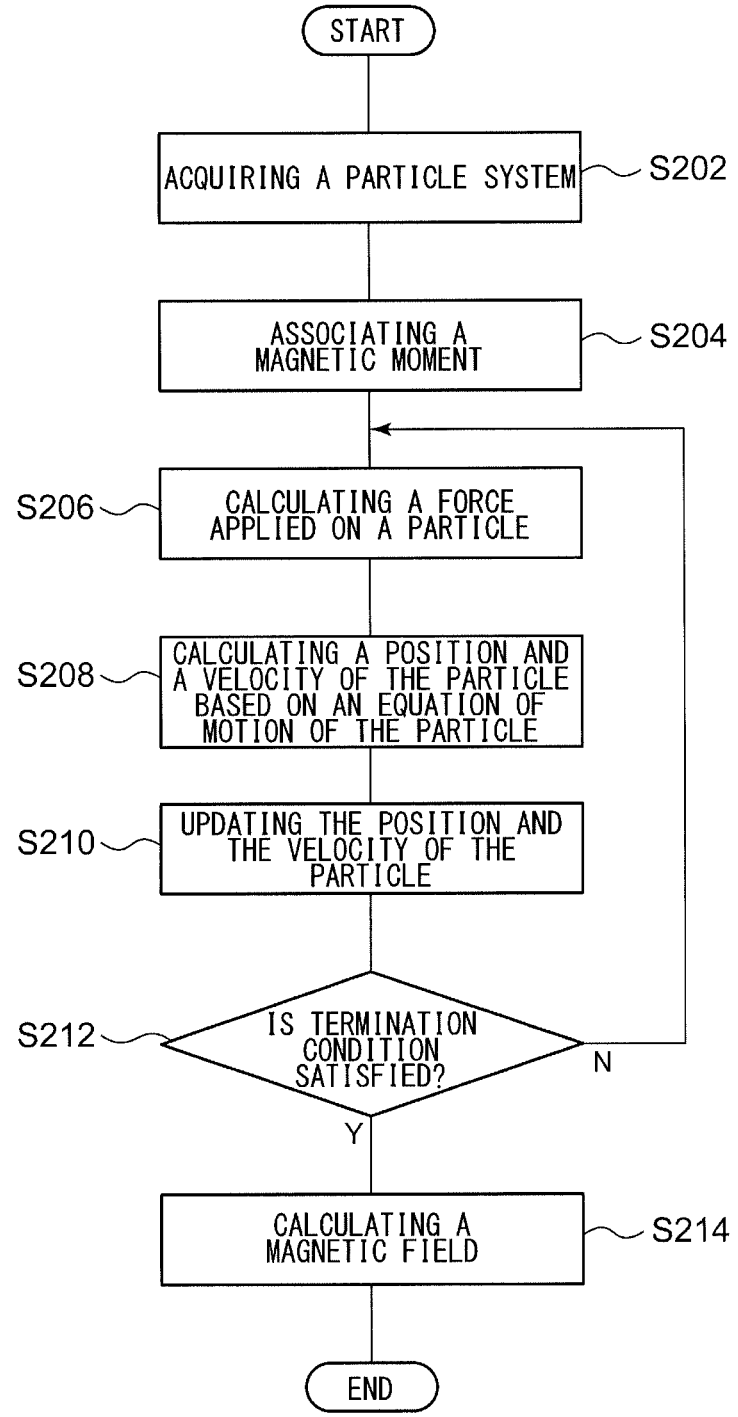
FIG. 3 is a flowchart showing an example of a series of processes in the analyzer of FIG. 1.

FIG. 3 is a flowchart showing an example of a series of processes in the analyzer 100. The particle system acquisition unit 108 is operative to acquire the particle system renormalized based on the RMD method (S202). The magnetic moment association unit 110 is operative to associate a magnetic moment with a particle of the acquired particle system (S204). The force calculation unit 122 is operative to calculate the force applied to a particle based on particle-particle distances (S206). The particle state calculation unit 124 is operative to calculate the velocity and the position of a particle according to the equation of motion of the particle, the equation including the calculated force (S208). The state update unit 126 is operative to update the position and the velocity stored by the particle data storing unit 114 with the calculated position and velocity (S210). The termination condition deciding unit 128 is operative to decide whether the termination condition is met (S212). If the termination condition is not met (N of S212), the process returns to S206. If the termination condition is met (Y of S212), the magnetic field calculation unit 132 is operative to calculate the magnetic field created by the particle system (S214).

In general, the particle method preferably can analyze a dynamic object to be analyzed such as fluid, separation phenomena or cutting work. Then, in the analyzer 100 according to the present embodiment, both the analysis based on the particle method and the analysis based on the magnetic moment are realized. Therefore, it is possible to analyze a dynamic object to be analyzed with higher accuracy and with shorter calculation time, including a magnetic property such as the magnetic field.

For example, if the object to be analyzed is iron sand, it is difficult to simulate such object with a prior art mesh-based analysis method, like FEM, since proper arrangement of mesh is not possible. However, in the analyzer 100 according to the present embodiment, it is possible to preferably analyze the iron sand with the particle method in consideration of magnetic property of the iron sand.

For example, if the object to be analyzed is a motor, the prior art mesh-based analysis method is not effective to such object since a rotor rotates with respect to a stator. The prior art method may allow static analysis only. However, in the analyzer 100 according to the present embodiment, it is possible to dynamically deal with magnetic interaction between the rotor and the stator while enabling high-accuracy simulations of rotations of the rotor using the particle method.

The followings are descriptions of the principle of the analysis method used for the analyzer 100.

The magnetic field can be obtained from a macroscopic vector potential (defined as)

(eqn1)
$$A(x) = \frac{\mu_0}{4\pi} \int \frac{J(x')}{|x-x'|} d^3x')$$

in the following manner. The z axis is defined to be the direction of spin and "a" is defined to be a radius of atom. A circle current that generates spin $S_{jz}$ (magnetic moment $m_{jz}$) is expressed as follows.

(eqn2)
$$I_j = \frac{m_{jz}}{\pi a^2}, m_{jz} = g\mu_B S_{jz}$$

A magnetic field created by a single spin located at a lattice point j is expressed as follows.

(eqn3)

$$B_r(x_p - x_j) = \frac{\mu_0 m_{jz}}{2\pi a r_{pj}} \sum_{n=0}^{\infty} \frac{(-1)^n (2n+1)!!}{2^n n!} \frac{r_{pj<}^{2n+1}}{r_{pj>}^{2n+2}} P_{2n+1}(\cos\theta_j) \quad (P\cdot 1)$$

$$B_\theta(x_p - x_j) = \quad (P\cdot 2)$$

$$-\frac{\mu_0 m_{jz}}{4\pi} \sum_{n=0}^{\infty} \frac{(-1)^n (2n+1)!!}{2^n (n+1)!} \left\{ \begin{array}{c} -\left(\frac{2n+2}{2n+1}\right)\frac{1}{a^3}\left(\frac{r_{pj}}{a}\right)^{2n} \\ \frac{1}{r_{pj}^3}\left(\frac{a}{r_{pj}}\right)^{2n} \end{array} \right\} P_{2n+1}^1(\cos\theta_j)$$

$$B_\phi(x_p - x_j) = 0 \quad (P\cdot 3)$$

Here, the following holds.

(eqn4)

$$r_{pj} = |x_p - x_j|, \quad \cos\theta_j = \frac{z_p - z_j}{r_{pj}}$$

If only n=0 is left, the magnetic field becomes equivalent to the magnetic field created by a sphere which is uniformly magnetized.

(eqn5)

$$M_j = m_j \bigg/ \frac{4}{3}\pi a^3$$

In the case where this method is applied to a bulk spherical body, if one adopts only n=0, uniform magnetization may not be obtained and the results will be similar to that of the magnetic moment method. This may be improved by adding higher order terms. Uniform magnetization is obtained in case of FEM.

The transformation into Cartesian coordinate system (using the following equation)

$$x_{pj} = r_{pj} \sin\theta_j \cos\phi_j, y_{pj} = r_{pj} \sin\theta_j \sin\phi_j \quad (\text{eqn6})$$

will give the following.

(eqn7)

$$B_x(x_p - x_j; m_{jz}) = (B_r(m_z)\sin\theta_j + B_\theta(m_z)\cos\theta_j)\cos\phi_j \quad (P\cdot 4)$$
$$= (B_r + B_\theta \cot\theta_j)\frac{x_{pj}}{r_{pj}}$$

$$B_y(x_p - x_j; m_{jz}) = (B_r(m_z)\sin\theta_j + B_\theta(m_z)\cos\theta_j)\sin\phi_j \quad (P\cdot 5)$$
$$= (B_r + B_\theta \cot\theta_j)\frac{y_{pj}}{r_{pj}}$$

$$B_z(x_p - x_j; m_{jz}) = B_r(m_z)\cos\theta_j - B_\theta(m_z)\sin\theta_j \quad (P\cdot 6)$$

Here, it should be noted that Bx=By=0 from B$_\theta$=0 when sin θ=0.

The magnetic fields when the magnetic moments m$_x$, m$_y$ are parallel to the x axis and the y axis, respectively, $$B(; m_x), B(; m_y) \quad (\text{eqn8})$$

can be found in a similar way.

(eqn9)

$$B_y(x_p - x_j; m_{jx}) = (B_r(m_x)\sin\theta_j + B_\theta(m_x)\cos\theta_j)\cos\phi_j \quad (P\cdot 7)$$
$$= (B_r + B_\theta \cot\theta_j)\frac{y_{pj}}{r_{pj}}$$

$$B_z(x_p - x_j; m_{jx}) = (B_r(m_x)\sin\theta_j + B_\theta(m_x)\cos\theta_j)\sin\phi_j \quad (P\cdot 8)$$
$$= (B_r + B_\theta \cot\theta_j)\frac{z_{pj}}{r_{pj}}$$

$$B_x(x_p - x_j; m_{jx}) = B_r(m_x)\cos\theta_j - B_\theta(m_x)\sin\theta_j \quad (P\cdot 9)$$

$$B_z(x_p - x_j; m_{jy}) = (B_r(m_y)\sin\theta_j + B_\theta(m_y)\cos\theta_j)\cos\phi_j \quad (P\cdot 10)$$
$$= (B_r + B_\theta \cot\theta_j)\frac{z_{pj}}{r_{pj}}$$

$$B_x(x_p - x_j; m_{jy}) = (B_r(m_y)\sin\theta_j + B_\theta(m_y)\cos\theta_j)\sin\phi_j \quad (P\cdot 11)$$
$$= (B_r + B_\theta \cot\theta_j)\frac{x_{pj}}{r_{pj}}$$

$$B_y(x_p - x_j; m_{jy}) = B_r(m_y)\cos\theta_j - B_\theta(m_y)\sin\theta_j \quad (P\cdot 12)$$

The magnetic field $$B_o \quad (\text{eqn11})$$

at $$x_p \quad (\text{eqn10})$$

and contributions from N spins can be found as (eqn12)

$$B_o(x_p) = \sum_{j \neq p}^{N} [B(x_p - x_j; m_{jx}) + B(x_p - x_j; m_{jy}) + B(x_p - x_j; m_{jz})] \quad (P\cdot 13)$$

$$M_p = \frac{3}{\mu_o}\left(\frac{\mu - \mu_o}{\mu + 2\mu_o}\right)\tilde{B}_o(x_p) \quad (P\cdot 14)$$

$$B_o(x_p) = B_m(x_p) + \mu_o H_{ext} \quad (P\cdot 15)$$

$$m_p = (m_{px}, m_{py}, m_{pz}) = \frac{4}{3}\pi a^3 M_p \quad (P\cdot 16)$$

Here, $$\tilde{B} \quad (\text{eqn13})$$

represents an average in a sphere. By combining P-13 and P-16, the magnetic moment m$_p$ can be obtained. The magnetic field created outside the magnetic body is represented by P-13. The magnetic field created inside the magnetic body is represented by (eqn14)

$$B_{in} = B_o + \frac{2\mu_o}{3}M \quad (P\cdot 17)$$

$$H_{in} = \frac{1}{\mu_o}B_o - \frac{1}{3}M \quad (P\cdot 18)$$

By considering a demagnetizing field due to magnetization created on a surface of the sphere, P-14 satisfies the following.

$$\nabla \cdot M_p = 0 \quad (\text{eqn15})$$

P-13 is slow to converge since the matrix is not a superdiagonal angle (i.e. j=p is excluded). Thus, a solution should be obtained from the following equation of motion.

(eqn16)

$$\mathcal{L} = \sum_i \left[ \frac{1}{2} m_v (1+\chi)(\dot{m}_i \cdot \dot{m}_i) - \frac{1}{2}(m_i - \alpha B_o(r_i))^2 \right] \quad (P \cdot 19)$$

$$m_v \frac{d\dot{m}_i}{dt} = -\frac{1}{1+\chi}(m_i - \alpha B_o(r_i)) - \gamma \dot{m}_i \quad (P \cdot 20)$$

$$\alpha = \frac{4\pi a^3}{\mu_o}\left(\frac{\mu - \mu_o}{\mu + 2\mu_o}\right) \quad (P \cdot 21)$$

Here, $m_v = 5 \times 10^{-2} dt^2$ is a virtual mass and $\gamma = m_v/(10\, dt)$ is a damping coefficient.

It is possible to realize further acceleration with an addition of FIRE. The code of the FIRE is shown below. The calculation result is 10.05 [s] under the condition that the number of particles is 802 and the residual is less than $10^{-8}$. The residual is not below $10^{-5}$ without FIRE.

Ordinary Step

Calculate $m$, force, and $\dot{m}$ from Eq.(P·20)

Fire Step $P$=force·$\dot{m}$;

$\dot{m}_\alpha$=|$\dot{m}$|,$f_\alpha$=|force|+DBL_MIN;

$\dot{m}$=$\dot{m}$(1.0−α)+(force/$f_\alpha$)$\dot{m}_\alpha$α;

if($P$>0.0)$n$++;

if($n$>5){α=0.99α;$n$=0;} if($P$<=0.0){$\dot{m}$=0.0;α=0.1;$n$=0;}   (eqn17)

Special cases of the Legendre functions and the associated Legendre functions are listed below (x := cos θ$_j$).

(eqn18)

$P_0(x) = 1$ (P·22)

$P_1(x) = x$ (P·23)

$P_2(x) = \frac{1}{2}(3x^2 - 1)$ (P·24)

$P_3(x) = \frac{1}{2}(5x^3 - 3x)$ (P·25)

$P_4(x) = \frac{1}{8}(35x^4 - 30x^2 + 3)$ (P·26)

$P_5(x) = \frac{1}{8}(63x^5 - 70x^3 + 15x)$ (P·27)

and (P·28)

$P_1^1(x) = -(1 - x^2)^{1/2}$ (P·29)

$P_3^1(x) = -\frac{3}{2}(1 - x^2)^{1/2}(5x^2 - 1)$ (P·30)

$P_3^2(x) = 15(1 - x^2)x$ (P·31)

$P_3^3(x) = -15(1 - x^2)^{3/2}$ (P·32)

$P_5^1(x) = -\frac{1}{8}(1 - x^2)^{1/2}(315x^4 - 210x^2 + 15)$ (P·33)

The magnetization $M$   (eqn19)

of a magnetic sphere (the magnetic susceptibility is 999) placed in an uniform external field of $B_{ox}$=0.1 [T] in the x direction is calculated and the results of the calculations are shown below. In the calculations, it is assumed that the number of particles (atoms) forming the sphere is 4009 and that those particles are arranged in fcc structure. The exact solution is (eqn20)

$$M = \frac{3}{\mu_o}\left(\frac{\mu - \mu_o}{\mu + 2\mu_o}\right) B_o$$

FIGS. 4, 5, 6 and 7 show the results of the first-fourth order of multipole expansion. Those Figures show cross-sections which pass the center. As the order of the multipole expansion increases, it can be seen that the results get closer to the exact solution. The convergence is deteriorated if the order is low. Most of the calculation time is occupied with calls for spherical harmonics.

Figure 4:
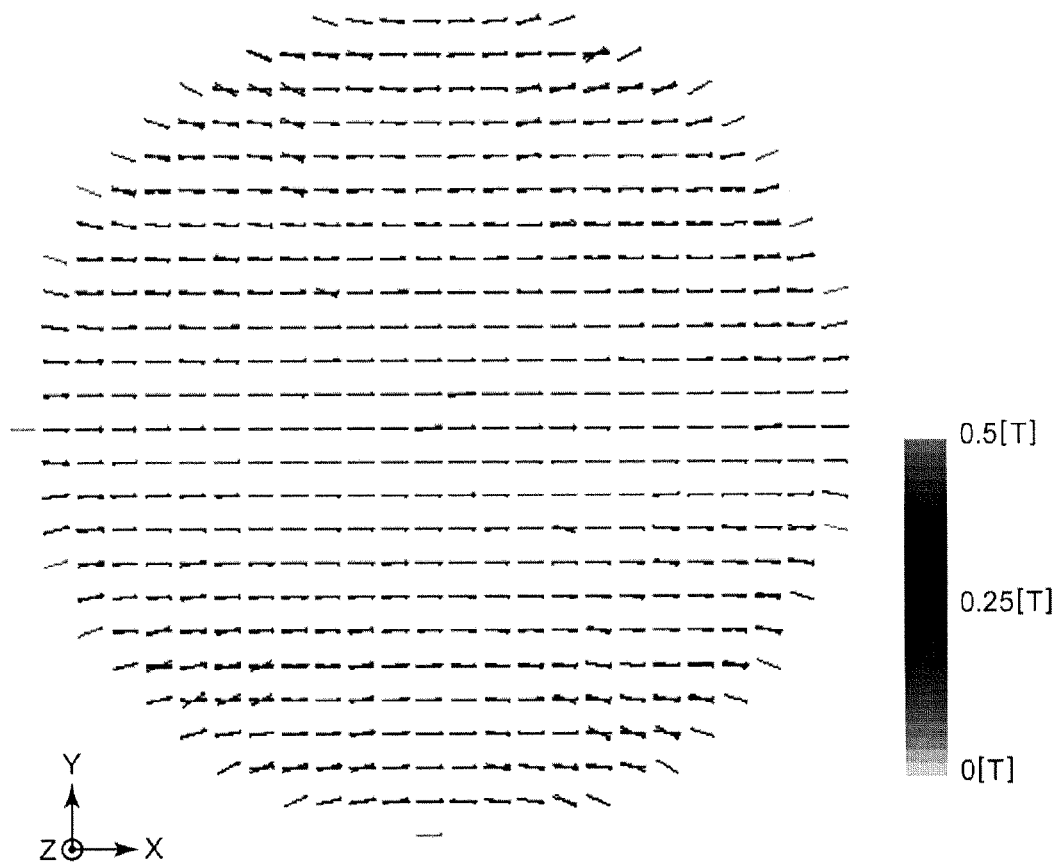
FIG. 4 is a diagram showing results of calculations corresponding to an expansion to n=1 order.

FIG. 4 is a diagram showing results of calculations corresponding to an expansion to n=1 order. The exact solution is $\mu_0 M_x$=0.2991 [T], which can compared to the calculation result of 0.346231 [T] in average. It can be seen that the magnetization is uniform and parallel to the external field ($B_x$=0.1 [T]). The residual is less than or equal to 1e-13 and the calculation time is about 80 minutes.

Figure 5:
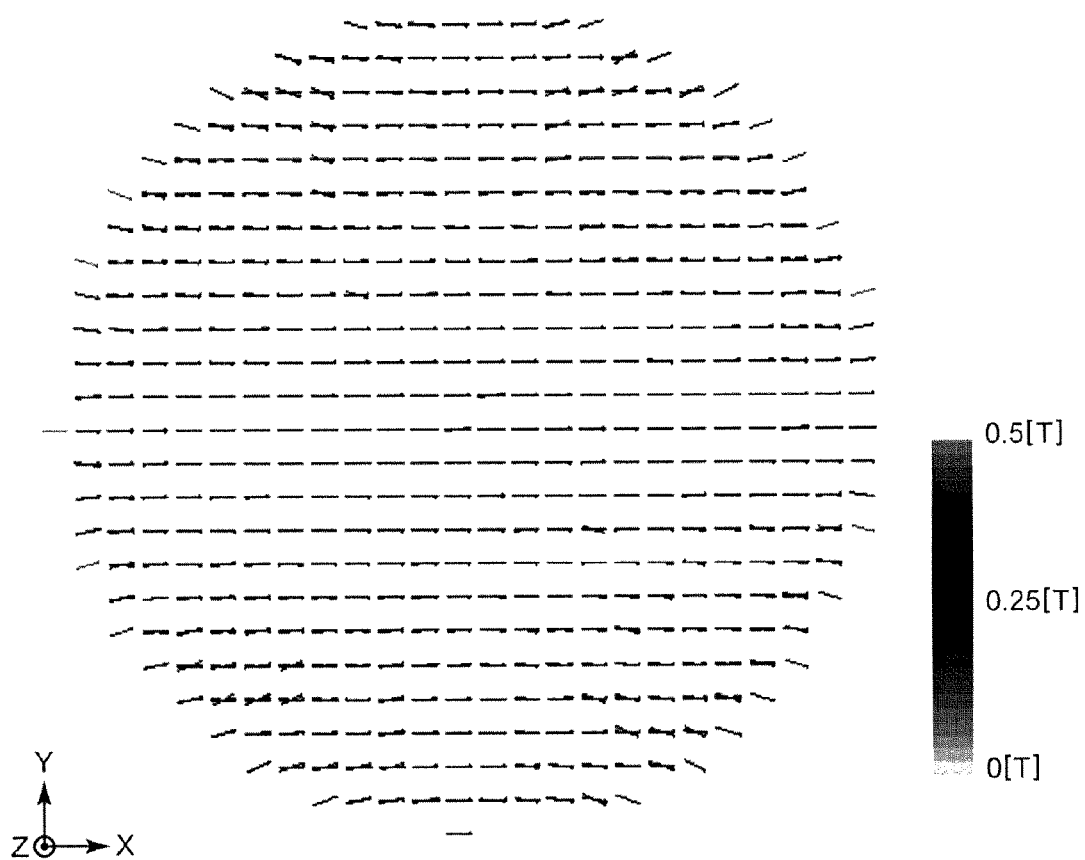
FIG. 5 is a diagram showing results of calculations corresponding to an expansion to n=2 order.

FIG. 5 is a diagram showing results of calculations corresponding to an expansion to n=2 order. The exact solution is $\mu_0 M_x$=0.2991 [T], which can compared to the calculation result of 0.321891 [T] in average. It can be seen that the magnetization is uniform and parallel to the external field ($B_x$=0.1 [T]). The residual is less than or equal to 1e-8 and the calculation time is about 3 hours. The residual does not decrease below 1e-9.

Figure 6:
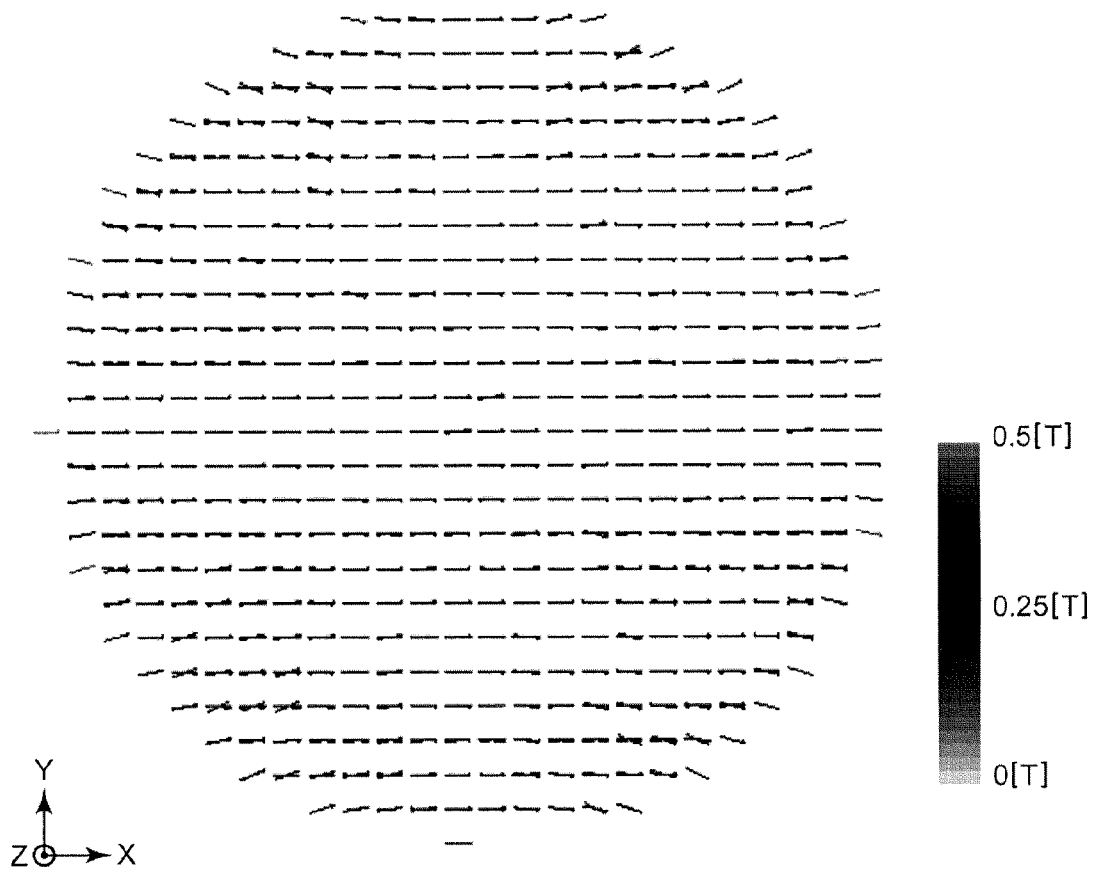
FIG. 6 is a diagram showing results of calculations corresponding to an expansion to n=3 order.

FIG. 6 is a diagram showing results of calculations corresponding to an expansion to n=3 order. The exact solution is $\mu_0 M_x$=0.2991 [T], which can compared to the calculation result of 0.312444 [T] in average. It can be seen that the magnetization is uniform and parallel to the external field ($B_x$=0.1 [T]).

Figure 7:
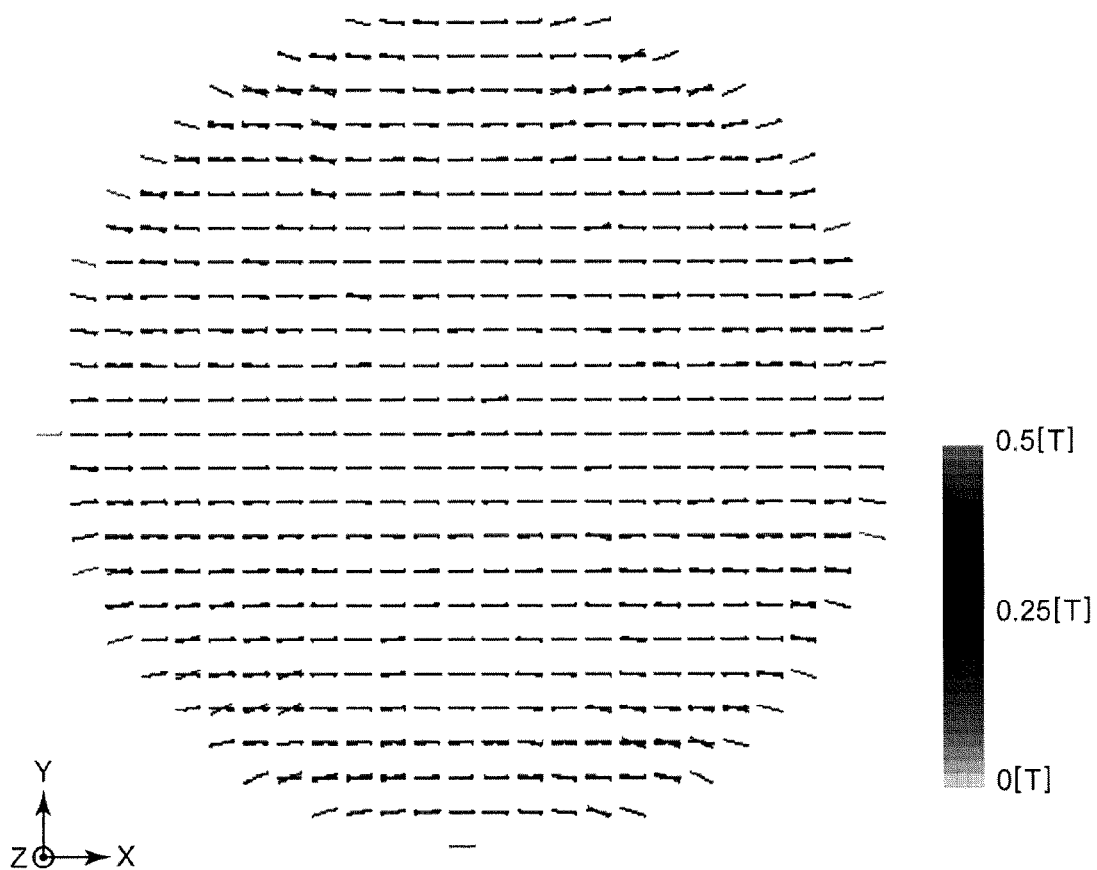
FIG. 7 is a diagram showing results of calculations corresponding to an expansion to n=4 order.

FIG. 7 is a diagram showing results of calculations corresponding to an expansion to n=4 order. The exact solution is $\mu_0 M_x$=0.2991 [T], which can compared to the calculation result of 0.312222 [T] in average. It can be seen that the magnetization is uniform and parallel to the external field ($B_x$=0.1 [T]). The residual does not decrease below 1e-9 after about 5 hours.

Figure 8:
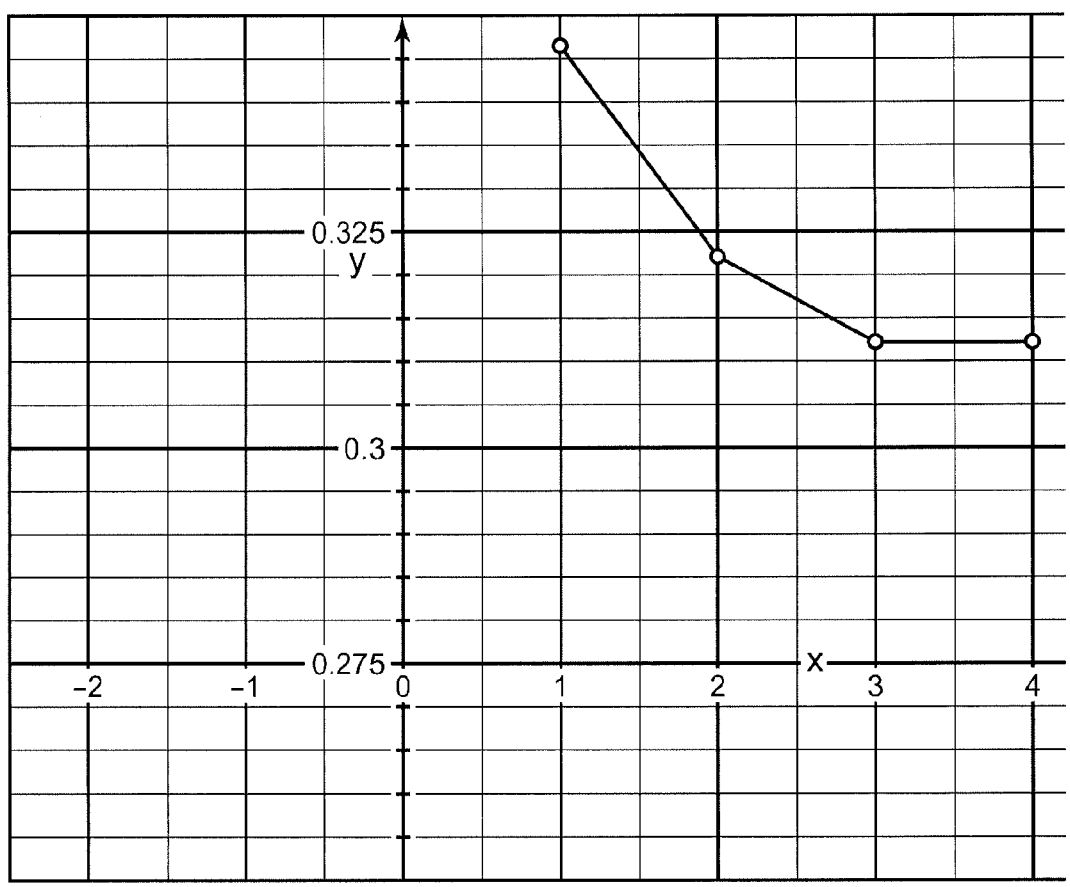
FIG. 8 is a diagram showing a relationship between orders of spherical harmonics and calculation values.

FIG. 8 is a diagram showing a relationship between orders of spherical harmonics and calculation values. It can be seen that a higher order gives results closer to the exact solution.

The principle of the analysis method used in the analyzer 100 can be described as follows.

(eqn21)

$$\mathcal{L} = \mathcal{L}_{MD} + \mathcal{L}_{ED} + \mathcal{L}_{EM} \quad (Q \cdot 1)$$

$$\mathcal{L}_{MD} = \sum_i^N \left[\frac{1}{2} M_p V_i^2 - \Phi(x_i) - V_i \cdot A(x_i)\right] \quad (Q \cdot 2)$$

$$\mathcal{L}_{ED} = \sum_e^N \left[\frac{1}{2} m_e v_e^2 + e v_e\right] \quad (Q \cdot 3)$$

$$\mathcal{L}_{EM} = \sum_m \delta V_m \left[\frac{1}{2} m_v (\dot{H}_{om} \cdot \dot{H}_{om}) - \frac{1}{2} \mu_o \lambda_i (H_{om} - H_o(x_m))^2\right] \quad (Q \cdot 4)$$

$M_p$ is a mass of nucleus, $m_e$ is a mass of electron. "e" is (an absolute value of) a charge of an nucleus or an electron. The charge and the mass of electron may not explicitly appear since the charge is converted to a current and the mass of electron is added to the mass of nucleus to give a mass M of atom in the end. $\delta V$ is a volume of the magnetic sphere, $m_v$ is the virtual mass, $\lambda_i$ is a Lagrangian undetermined coefficient. To satisfy constraints rigorously, it is necessary to use a convergence calculation like the SHAKE method; however, in this method, it is assumed that $\lambda_i=1$ and that small vibrations around the true solution is treated as errors.

The direction of spin is defined as z axis. "a" is an radius of atom. The circle current that creates spin $S_{jz}$ (magnetic moment $m_{jz}$) at a lattice point j is (eqn22)

$$I_j = \frac{m_{jz}}{\pi a^2}, \quad m_{jz} = g \mu_B S_{jz}$$

Therefore, the magnetic field can be driven from the macroscopic vector potential (eqn23)

$$A(x) = \frac{\mu_0}{4\pi} \int \frac{J(x')}{|x-x'|} d^3 x'$$

as follows.

(eqn24)

$$H_r(r_{pj}) = \frac{m_{jz}}{2\pi a r_{pj}} \sum_{n=0}^{\infty} \frac{(-1)^n (2n+1)!!}{2^n n!} \frac{r_{pj<}^{2n+1}}{r_{pj>}^{2n+2}} P_{2n+1}(\cos\theta_j) \quad (Q \cdot 5)$$

$$H_\theta(r_{pj}) = \quad (Q \cdot 6)$$
$$-\frac{m_{jz}}{4\pi} \sum_{n=0}^{\infty} \frac{(-1)^n (2n+1)!!}{2^n (n+1)!} \left\{\begin{array}{l}-\left(\frac{2n+2}{2n+1}\right)\frac{1}{a^3}\left(\frac{r_{pj}}{a}\right)^{2n} \\ \frac{1}{r_{pj}^3}\left(\frac{a}{r_{pj}}\right)\end{array}\right\} P_{2n+1}^1(\cos\theta_j)$$

$$H_\phi(r_{pj}) = 0 \quad (Q \cdot 7)$$

Here, the following holds.

(eqn25)

$$r_{pj} = |x_p - x_j|, \quad \cos\theta_j = \frac{z_p - z_j}{r_{pj}}$$

Leaving only n=0 will give the magnetic field which is equivalent to the magnetic field created by a sphere which is uniformly magnetized.

(eqn26)

$$M_j = m_j \bigg/ \frac{4}{3}\pi a^3$$

The transformation into Cartesian coordinate system (using the following equation)

$$x_{pj} = r_{pj} \sin\theta_j \cos\phi_j, \quad y_{pj} = r_{pj} \sin\theta_j \sin\phi_j \quad (\text{eqn27})$$

will give the following.

(eqn28)

$$H_x(r_{pj}; m_{jz}) = \quad (Q \cdot 8)$$
$$\{H_r(r_{pj}; m_z)\sin\theta_j + H_\theta(r_{pj}; m_z)\cos\theta_j\}\cos\phi_j = (H_r + H_\theta \cot\theta_j)\frac{x_{pj}}{r_{pj}}$$

$$H_y(r_{pj}; m_{jz}) = \quad (Q \cdot 9)$$
$$\{H_r(r_{pj}; m_z)\sin\theta_j + H_\theta(r_{pj}; m_z)\cos\theta_j\}\sin\phi_j = (H_r + H_\theta \cot\theta_j)\frac{y_{pj}}{r_{pj}}$$

$$H_z(r_{pj}; m_{jz}) = H_r(r_{pj}; m_z)\cos\theta_j - H_\theta(r_{pj}; m_z)\sin\theta_j \quad (Q \cdot 10)$$

Here, it should be noted that Hx=Hy=0 from $H_\theta=0$ when $\sin\theta_j=0$. The magnetic fields when the magnetic moments $m_x$, $m_y$ are parallel to the x axis and the y axis, respectively, $$H(; m_x), H(; m_y) \quad (\text{eqn29})$$

can be found in a similar way.

(eqn30)

$$H_y(r_{pj}; m_{jx}) = \quad (Q \cdot 11)$$
$$\{H_r(r_{pj}; m_x)\sin\theta_j + H_\theta(r_{pj}; m_x)\cos\theta_j\}\cos\phi_j = (H_r + H_\theta \cot\theta_j)\frac{y_{pj}}{r_{pj}}$$

$$H_z(r_{pj}; m_{jx}) = \quad (Q \cdot 12)$$
$$\{H_r(r_{pj}; m_x)\sin\theta_j + H_\theta(r_{pj}; m_x)\cos\theta_j\}\sin\phi_j = (H_r + H_\theta \cot\theta_j)\frac{z_{pj}}{r_{pj}}$$

$$H_x(r_{pj}; m_{jx}) = H_r(r_{pj}; m_x)\cos\theta_j - H_\theta(r_{pj}; m_x)\sin\theta_j \quad (Q \cdot 13)$$

$$\cos\theta_j = \frac{x_p - x_j}{r_{pj}} \quad (Q \cdot 14)$$

$$H_z(r_{pj}; m_{jy}) = \quad (Q \cdot 15)$$
$$\{H_r(r_{pj}; m_y)\sin\theta_j + H_\theta(r_{pj}; m_y)\cos\theta_j\}\cos\phi_j = (H_r + H_\theta \cot\theta_j)\frac{z_{pj}}{r_{pj}}$$

$$H_x(r_{pj}; m_{jy}) = \quad (Q \cdot 16)$$
$$\{H_r(r_{pj}; m_y)\sin\theta_j + H_\theta(r_{pj}; m_y)\cos\theta_j\}\sin\phi_j = (H_r + H_\theta \cot\theta_j)\frac{x_{pj}}{r_{pj}}$$

$$H_y(r_{pj}; m_{jy}) = H_r(r_{pj}; m_y)\cos\theta_j - H_\theta(r_{pj}; m_y)\sin\theta_j \quad (Q \cdot 17)$$

-continued $$\cos\theta_j = \frac{y_p - y_j}{r_{pj}} \quad \text{(Q·18)}$$

The external magnetic field (contributions from N spins)

$H_m$ (eqn32)

felt by a moment at $X_p$ (eqn31)

is (eqn33)

$$H_m(x_p) = \sum_{j \neq p}^{N} [H(r_{pj}; m_{jx}) + H(r_{pj}; m_{jy}) + H(r_{pj}; m_{jz})] \quad \text{(Q·19)}$$

$$m_p = (m_{px}, m_{py}, m_{pz}) = M_p \delta V_p \quad \text{(Q·20)}$$

The induced magnetic field $H_{ind}$ (eqn34)

is driven from (eqn35)

$$H_{ind}(x_p) = -\sum_j G(|x_p - x_j|) \frac{DB(x_j, t)}{Dt} \quad \text{(Q·21)}$$

$$G(r_{pj}) = \begin{cases} \frac{\sigma_j}{3}\left(\frac{a^3}{r_{pj}}\right) & r_{pj} > a \\ \sigma_j\left(\frac{a^2}{2} - \frac{r_{pj}^2}{6}\right) & r_{pj} < a \end{cases} \quad \text{(Q·22)}$$

When the renormalization is performed, the electrical conductance σ is given by the following.

$\sigma' = \sigma\alpha^{\delta/2+1}$ (eqn36)

Here, δ=2.

The Lagrange differential of the right side of Q-21

$$\frac{DB}{Dt} \quad \text{(eqn37)}$$

can be replaced with $\dot{B}_j$ (eqn38)

since it is the particle method. It should be noted that translational motions of magnetizations can be considered by motions of particles; however, rotations of the magnetization vectors should be considered separately (Landau and Lifshitz, Electromagnetism, Chapter 51).

The magnetic field created outside the magnetic body is given by Q-26. The magnetic field created inside the magnetic body is (eqn39)

$$B = \mu_o\left(H_o + \frac{2}{3}M(H)\right) \quad \text{(Q·23)}$$

$$H = H_o - \frac{1}{3}M(H) \quad \text{(Q·24)}$$

$$B = \mu_o \frac{1 + \chi(H)}{1 + \chi(H)/3} H_o, \chi(H) = \frac{dM}{dH} \quad \text{(Q·25)}$$

It should be noted that $\dot{B}$ (eqn40)

is also nonlinear. The relationship between the total external field $H_o$ (eqn41)

and the magnetization $M$ (eqn42)

is (eqn43)

$$H_o(x_p) = H_m(x_p) + H_{ind}(x_p) + H_{ext} \quad \text{(Q·26)}$$

$$M = \quad \text{(Q·27)}$$

$$\begin{cases} f(H) & \text{NON-LINEAR Material} \\ 3\left(\frac{\mu - \mu_o}{\mu + 2\mu_o}\right)H_o(x_p) & \text{A SPHERE OF LINEAR MATERIAL} \end{cases}$$

By combining Q-26 and Q-27, the magnetic moment is driven as follows.

$m_p$ (eqn44)

(Nonlinear Magnetization and Hysteresis)

The magnetic field $H$ (eqn45)

is removed from Q-27 and Q-24:

(eqn46)

$$M = f\left(H_o - \frac{1}{3}M\right), \text{ for only sphere} \quad \text{(Q·28)}$$

Figure 9:
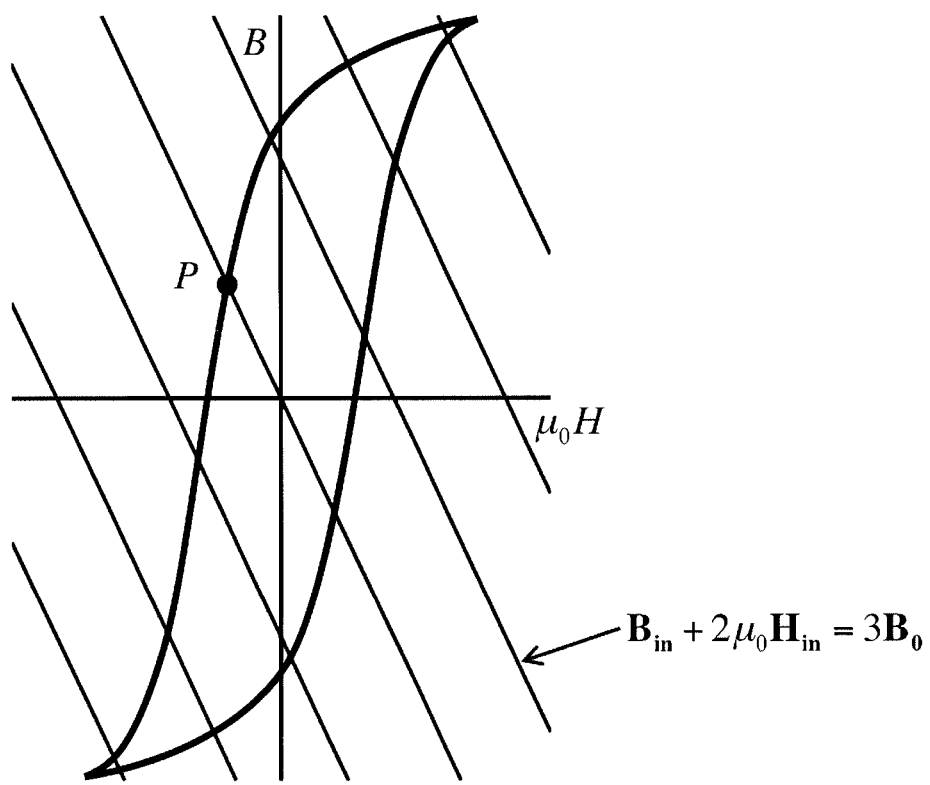
FIG. 9 is a diagram showing a hysteresis curve.

By solving Q-28, the following is obtained (FIG. 9 shows the case where B=f(H)).

$M = g(H_o)$ (eqn47)

FIG. 9 is a diagram showing a hysteresis curve. M is calculated using a point of intersection of the hysteresis curve and B+2μ₀H=3B₀. Now, the permanent magnetization is given as follows.

$M_c$ (eqn48)

The B-H curve with the above permanent magnetization is given as follows.

$B = \mu_o(M_c + \alpha H), \alpha < 1.$ (eqn49)

This can be combined with $B + 2\mu_o H = \mu_o H_o$ (eqn50)

to give (eqn51)

$$M = \frac{3}{2+a}\{M_c - (1-a)H_o\}$$

With regard to a general B=f(H), Newton-Laphson method can be used.

(The Quantize Method of Magnetic Field)

Q-19 is slow to converge since the matrix is not a superdiagonal angle (i.e. j=p is excluded). Thus, a solution should be obtained from the following equation of motion.

(eqn52)

$$\mathcal{L}_{EM} = \sum_i \left[ \frac{\mu_o}{2} m_v (\dot{H}_{oi} \cdot \dot{H}_{oi}) - \frac{\mu_o}{2} m_v \{H_{oi} - H_o(x_i)\}^2 \right] \quad (Q\cdot 29)$$

$$m_v \frac{d\dot{H}_{oi}}{dt} = -[H_{oi} - \{H_m(x_i) + H_{ext}(x_i)\}] - \sum_j G(r_{pj}) \dot{B}_j \quad (Q\cdot 30)$$

$$\frac{3}{2} \mu_o \sigma G(0) dt \ll m_v \ll 3\mu_o \sigma G(0) \sim 5 \times 10^{-17} \quad (Q\cdot 31)$$

SUFFICIENT CONDITION

Here, $m_v$ is a virtual mass. The recommended value is $100 \times 2.5 \times 10^{-17} dt$.

In the case where only static magnetic field is analyzed, the Green function $G(r_{pj})$ can be replaced with $\gamma \delta_{pj}/\mu_0$. Also, $m_v = 5 \times 10^1 dt^2$ and $\gamma = m_r/(100\ dt)$. A sufficiently small $m_v$ can induce a minute attenuation vibration around the true solution; thereby the errors can be reduced.

A model is considered.

(eqn53)

$$m_v \frac{d\dot{H}}{dt} = -k\{H - H_o \cos(\omega t)\} - \gamma \dot{H}$$

A solution of forced vibrations which has an attenuation term is (Landau and Lifshitz, Mechanics, Sec. 26)

(eqn54)

$$H = ae^{-\lambda t} \cos(\omega_c t + \alpha) + b\cos(\omega t + \delta), \quad (Q\cdot 32)$$

$$\lambda = \frac{\gamma}{2m}, \omega_o = \sqrt{\frac{k}{m_v}}, \omega_c = \sqrt{\omega_o^2 - \lambda^2}, \quad (Q\cdot 33)$$

$$b = \frac{kH_o/m_v}{\sqrt{(\omega_o^2 - \omega^2)^2 + 4\lambda^2\omega^2}}, \tan\delta = \frac{2\lambda\omega}{\omega^2 - \omega_o^2} \quad (Q\cdot 34)$$

If the following condition is considered, $$\omega \ll \omega_o, \omega \ll \lambda \quad (eqn55)$$

the following holds.

(eqn56)

$$H = b\cos(\omega t + \delta), \quad (Q\cdot 35)$$

$$b = \frac{kH_o}{\sqrt{k^2 + \gamma^2\omega^2}}, \tan\delta = -\frac{\gamma}{k}\omega \quad (Q\cdot 36)$$

In that, if $m_v$ is sufficiently small, the solution coincides with the solution of the following essential equation to be solved.

$$\gamma \dot{H} = -k\{H - H_o \cos(\omega t)\} \quad (eqn57)$$

(Discretization)

In the case where the discretization is performed according to the leapfrog method (the velocity is evaluated at an intermediate point between n and n+1), the following holds wherein s is the number of convergence.

(eqn58)

$$m_v \frac{\dot{H}_{oi}^{n+\frac{1}{2}} - \dot{H}_{oi}^{n-\frac{1}{2}}}{\delta t} = \quad (Q\cdot 37)$$

$$-[H_{oi}^n - \{H_m^n(x_i) + H_{ext}^n(x_i)\}] - \frac{1}{2} \sum_j^N G(r_{pj}) \left( \dot{B}_j^{n+\frac{1}{2}} + \dot{B}_j^{n-\frac{1}{2}} \right)$$

$$\dot{H}_{oi}^{s+1} = \dot{H}_{oi}^s + err, \quad (Q\cdot 38)$$

$$err = -\dot{H}_{oi}^s + \dot{H}_{oi}^{n-\frac{1}{2}} -$$

$$\frac{\delta t}{m_v} \left[ H_{oi}^n - \{H_m^n(x_i) + H_{ext}^n(x_i)\} + \frac{1}{2} \sum_j^N G(r_{pj}) \left( \dot{B}_j^s + \dot{B}_j^{n-\frac{1}{2}} \right) \right]$$

If only diagonal elements use future values, the way of solving becomes explicit and the efficiency will be improved by about 30 percent. Most of the calculations are calls for special functions.

(Acceleration Based on FIRE (it is Effective Only to the Static Magnetic Field Analysis))

It is possible to realize further acceleration with an addition of FIRE. The code of the FIRE is shown below. The calculation result is 10.05 [s] under the condition that the number of particles is 802 and the residual is less than $10^{-8}$. The residual is not below $10^{-5}$ without FIRE.

Ordinary Step (Q·39)

Calculate $H$, force, and $\dot{H}$ from Eq($Q\cdot 30$) (Q·40)

Fire Step (Q·41)

$P$=force$\cdot \dot{H}$;

$\dot{m}_\alpha = |\dot{H}|, f_\alpha = |\text{force}| + \text{DBL\_MIN}$;

$\dot{H} = \dot{H}(1.0-\alpha) + (\text{force}/f_\alpha)\dot{H}_\alpha \alpha$;

if($P$>0.0)$n$++;

if($n$>5){$\alpha$=0.99$\alpha$;$n$=0;} if($P$<=0.0){$\dot{H}$=0.0;$\alpha$=0.1;$n$=0;} (eqn59)

(Verification of Accuracy (with an Uniform Magnetization of a Sphere))

The magnetization $M$ (eqn60)

of a magnetic sphere (the magnetic susceptibility is 999) placed in an uniform external field of $B_{ox}$=0.1 [T] in the x direction is calculated and the results of the calculations are shown below. In the calculations, it is assumed that an electrical conductance is zero and that the number of particles (atoms) forming the sphere is 4009 and that those particles are arranged in fcc structure. The exact solution is (eqn61)
$$M = \frac{3}{\mu_o}\left(\frac{\mu - \mu_o}{\mu + 2\mu_o}\right)B_o$$

In this case, the calculation results are similar to those for FIGS. 4, 5, 6, 7 and 8.

Figure 10:
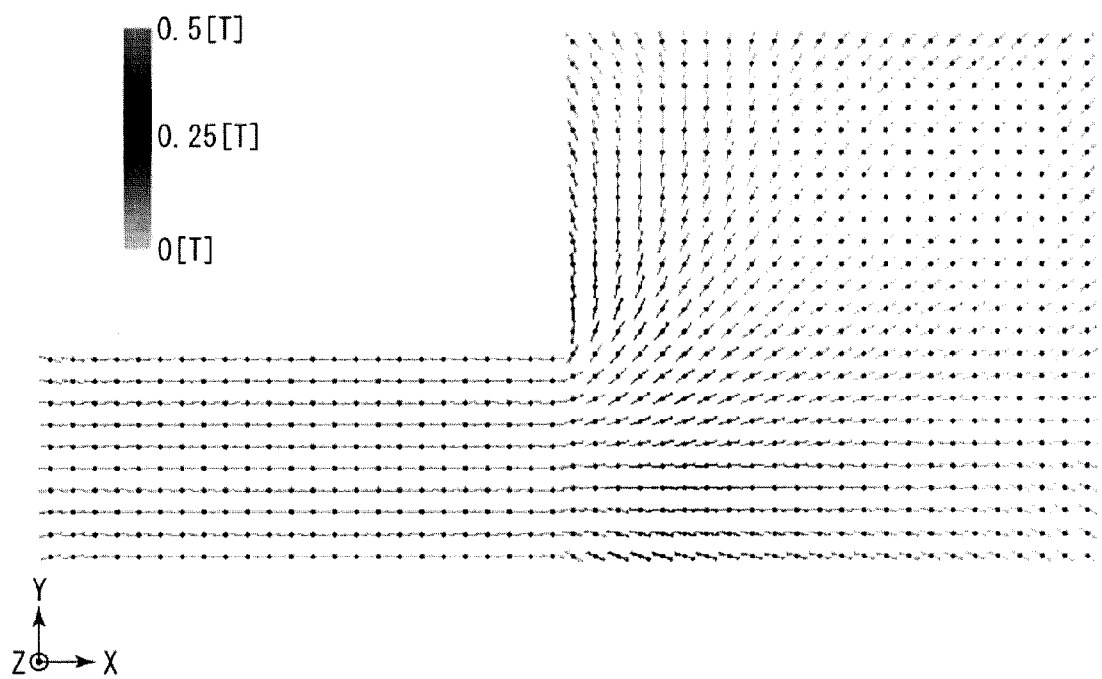
FIG. 10 is a diagram showing results of calculations of magnetization due to a permanent magnet (1.0 T)
Figure 11:
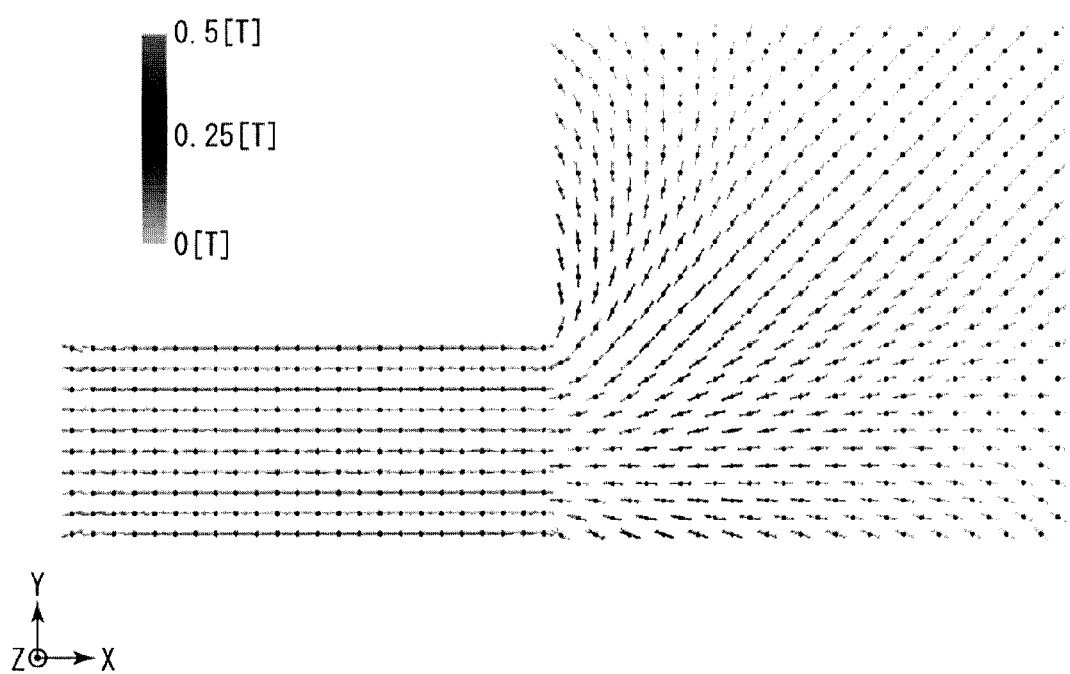
FIG. 11 is a diagram showing results of calculations of magnetization due to a permanent magnet (1.0 T)
Figure 12:
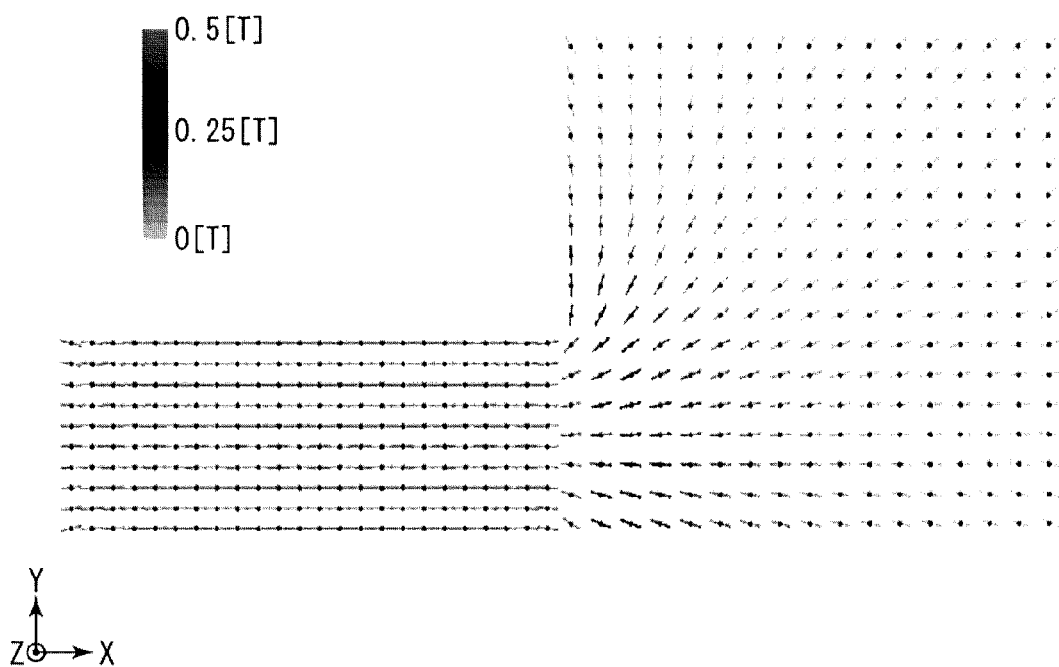
FIG. 12 is a diagram showing results of calculations of magnetization due to a permanent magnet (1.0 T).

FIGS. 10, 11 and 12 show the results of confirmation of looping patterns. In those Figures, "windings" of the magnetic field are not seen. Such "windings" can be seen according to the prior art magnetic moment method. With regard to arrangements of particles, if the arrangements are ordered (fcc, bcc, sc), it can be seen that the results are substantially the same.

FIG. 10 is a diagram showing results of calculations of magnetization due to a permanent magnet (1.0 T). The permanent magnet is arranged on bcc lattice and the magnetic body is placed on fcc lattice.

FIG. 11 is a diagram showing results of calculations of magnetization due to a permanent magnet (1.0 T). The permanent magnet is arranged on fcc lattice and the magnetic body is arranged on bcc lattice.

FIG. 12 is a diagram showing results of calculations of magnetization due to a permanent magnet (1.0 T). The permanent magnet is arranged on fcc lattice and the magnetic body is arranged on sc lattice. Since the atomic radius used is the one for fcc lattice, the magnetic field inside the magnetic body is rather small. The true solution can be found if the atomic radius is the one which is given by filling sc lattice.

(Series Representation of Legendre Functions)
Special cases of the Legendre functions and the associated Legendre functions are listed below ($x := \cos\theta_j$).

(eqn62)

$$P_0(x) = 1 \tag{Q-42}$$

$$P_1(x) = x \tag{Q-43}$$

$$P_2(x) = \frac{1}{2}(3x^2 - 1) \tag{Q-44}$$

$$P_3(x) = \frac{1}{2}(5x^3 - 3x) \tag{Q-45}$$

$$P_4(x) = \frac{1}{8}(35x^4 - 30x^2 + 3) \tag{Q-46}$$

$$P_5(x) = \frac{1}{8}(63x^5 - 70x^3 + 15x) \tag{Q-47}$$

and (Q-48)

$$P_1^1(x) = -(1 - x^2)^{1/2} \tag{Q-49}$$

$$P_3^1(x) = -\frac{3}{2}(1 - x^2)^{1/2}(5x^2 - 1) \tag{Q-50}$$

$$P_3^2(x) = 15(1 - x^2)x \tag{Q-51}$$

$$P_3^3(x) = -15(1 - x^2)^{3/2} \tag{Q-52}$$

$$P_5^1(x) = -\frac{1}{8}(1 - x^2)^{1/2}(315x^4 - 210x^2 + 15) \tag{Q-53}$$

(Derivation of the Force Applied to a Particle)
The Lagrangian describing the interaction between a particle (electron and nucleus) and a particle magnetic field is (eqn63)
$$\mathcal{L} = \sum_p^N \left[\frac{1}{2}M_p V_p^2 - \Phi(x_p) - V_p \cdot A(x_p)\right] + \sum_e^N \left[\frac{1}{2}m_e v_e^2 + ev_e \cdot A(x_e)\right]$$

The relationship between the vector potential $$A \tag{eqn64}$$

and an electromagnetic field is given by the following.

(eqn65)
$$B = \nabla \times A, \quad E = -\frac{\partial A}{\partial t}$$

If the following relationship is used, (eqn66)
$$\frac{dA}{dt} = \frac{\partial A}{\partial t} + (v_i \cdot \nabla)A, \quad \nabla(v_i \cdot A) = (v_i \cdot \nabla)A + v_i \times \nabla \times A$$

the following equation of motion can be derived.

(eqn67)
$$m_e \frac{dv_e}{dt} = ev_e \times B + eE \quad \text{for electron} \tag{R-1}$$

$$M_p \frac{dV_p}{dt} = -eV_p \times B - eE - \nabla\Phi(x_p) \quad \text{for nucleus} \tag{R-2}$$

The equation of motion for an atom $M = M_p + m_e$ is (eqn68)
$$M\frac{dV}{dt} = e(v_e - V_p) \times B(x_i) - \nabla\Phi(x_i) - e((x_e - x_p) \cdot \nabla)E(x_i), \tag{R-3}$$

$$x_i = \frac{m_e x_e + M_p x_p}{M_p + m_e}$$

With regard to the right side of the equation, by replacing the Lorentz force with an average current density $$j \tag{eqn69}$$

and replacing the electric moment with $$p_e, \tag{eqn70}$$

the following can be given.

(eqn71)
$$M\frac{dV_i}{dt} = j \times B(x_i)\delta V_i - (p_e \cdot \nabla)E - \nabla\Phi(x_i) \tag{R-4}$$

By combining the Maxwell's equations and Q-24, the following can be given.

(eqn72)
$$j = \nabla \times H,$$
$$H = \begin{cases} H_o - \frac{1}{3}M(H) & \text{NON-LINEAR MATERIAL} \\ \frac{3\mu_o}{\mu + 2\mu_o}H_o & \text{LINEAR MATERIAL} \end{cases}$$

In the end, the force applied on the atom is, if electric polarization is neglected, (eqn73)|
$$f(x_i) = (\nabla \times H) \times B(x_i)\delta V_i - \nabla\Phi)(x_i) \quad (R \cdot 5)$$

The force applied on the particle can be derived directly from the Maxwell's stress tensor.

(eqn74)
$$f_\alpha = \frac{\partial}{\partial x_\beta}T^{\alpha\beta} = [\nabla \times H \times B]_\alpha \quad (R \cdot 6)$$
$$T_{\alpha\beta} = \frac{1}{\mu_o}B_\alpha B_\beta - \frac{1}{2\mu_o}B \cdot B\delta_{\alpha\beta} \quad (R \cdot 7)$$

The moment created by localized current at the sphere can be expressed as the following.

$$m \quad (eqn75)|$$

The force applied on the moment is, to the smallest order, $$f = (m \times \nabla) \times B = \nabla(m \cdot B) - m(\nabla \cdot B) = \nabla(m \cdot B) \quad (eqn76)|$$

Therefore, the potential energy is expressed as the following together with the potential energy due to electric polarization.

$$U = -m \cdot B + p_e \cdot E \quad (eqn77)|$$

This does not include eddy current or true current.

(eqn78)
$$j = \nabla \times \left(H_o - \frac{1}{3}M\right) \quad (R \cdot 8)$$
$$= \nabla \times H_o - \frac{1}{3}\frac{dM(H)}{dH}\nabla \times H \quad (R \cdot 9)$$
$$\therefore j = \frac{1}{1 + \chi/3}\nabla \times H_o \quad (R \cdot 10)$$

$$(R \cdot 11)$$

As a result, by calculating $$\nabla \times H_o \quad (eqn79)|,$$

the magnetic force applied on the magnetic sphere can be derived.

(Current Due to Magnetization)
Although it would be difficult to completely separate $$j_m \quad (eqn80)|$$

and the eddy current $$j_{eddy} \quad (eqn81)|,$$

the following holds respectively.

(eqn82)
$$j_m(x_p) = \frac{1}{1 + \chi/3}\nabla \times H_m \quad (R \cdot 12)$$
$$j_{eddy}(x_p) = \frac{1}{1 + \chi/3}\nabla \times H_{eddy} \quad (R \cdot 13)$$

(Calculation of Differential Coefficients)
The followings are the required differential coefficients. Based on the following expressions (eqn83)
$$\frac{d}{d\cos\theta}P_{2n+1}(\cos\theta) = -\frac{1}{\sin\theta}P^1_{2n+1}(\cos\theta) \quad (R \cdot 14)$$
$$\frac{d}{d\cos\theta}P^1_{2n+1}(\cos\theta) = -\frac{1}{\sin\theta}P^2_{2n+1}(\cos\theta) \quad (R \cdot 15)$$
$$\frac{\partial}{\partial r}\left(\frac{r_<^{2n+1}}{r_>^{2n+2}}\right) = \begin{cases} -(2n+2)\frac{a^{2n+1}}{r^{2n+3}} & r > a \\ (2n+1)\frac{r^{2n}}{a^{2n+2}} & r < a \end{cases} \quad (R \cdot 16)$$

$$\frac{\partial}{\partial r}\begin{Bmatrix} \frac{1}{r^3}\left(\frac{a}{r}\right)^{2n} & r > a \\ -\left(\frac{2n+2}{2n+1}\right)\frac{1}{a^3}\left(\frac{r}{a}\right)^{2n} & r < a \end{Bmatrix} = \quad (R \cdot 17)$$
$$\begin{Bmatrix} -(2n+3)\frac{1}{r^4}\left(\frac{a}{r}\right)^{2n} & r > a \\ -2n\left(\frac{2n+2}{2n+1}\right)\frac{1}{a^4}\left(\frac{r}{a}\right)^{2n-1} & r < a \end{Bmatrix},$$

listing of only $r_{pj} > a$ (here, since $$P_{2n+1}{}^1, P_{2n+1}{}^2 \quad (eqn81)|$$

is proportional to $\sin\theta$, there is no divergence at $\theta = 0$) gives the followings.

(eqn85)
$$\frac{\partial H_r(r_{pj})}{\partial r_{pj}} = \quad (R \cdot 18)$$
$$-\frac{m_{jz}}{\pi}\sum_{n=0}^{\infty}\frac{(-1)^n(2n+1)!!(n+1)}{2^n n!}\frac{1}{r_{pj}^4}\left(\frac{a}{r_{pj}}\right)^{2n}P_{2n+1}(\cos\theta_{pj})$$

$$\frac{\partial H_r(r_{pj})}{r_{pj}\partial\cos\theta_{pj}} = -\frac{m_{jz}}{2\pi}\sum_{n=0}^{\infty}\frac{(-1)^n(2n+1)!!}{2^n n!}\frac{1}{r_{pj}^4}\left(\frac{a}{r_{pj}}\right)^{2n}\frac{P^1_{2n+1}(\cos\theta_{pj})}{\sin\theta_{pj}} \quad (R \cdot 19)$$

$$\frac{\partial H_\theta(r_{pj})}{\partial r_{pj}} = \quad (R \cdot 20)$$
$$\frac{m_{jz}}{4\pi}\sum_{n=0}^{\infty}\frac{(-1)^n(2n+1)!!(2n+3)}{2^n(n+1)!}\frac{1}{r_{pj}^4}\left(\frac{a}{r_{pj}}\right)^{2n}P^1_{2n+1}(\cos\theta_{pj})$$

$$\frac{\partial H_\theta(r_{pj})}{r_{pj}\partial\cos\theta_{pj}} = \frac{m_{jz}}{4\pi}\sum_{n=0}^{\infty}\frac{(-1)^n(2n+1)!!}{2^n(n+1)!}\frac{1}{r_{pj}^4}\left(\frac{a}{r_{pj}}\right)^{2n}\frac{P^2_{2n+1}(\cos\theta_{pj})}{\sin\theta_{pj}} \quad (R \cdot 21)$$

$$\frac{\partial H_r(r_{pj}, \theta_{pj})}{\partial x_p} = \frac{\partial H_r}{\partial r_{pg}}\frac{x_{pj}}{r_{pj}} - \frac{\partial H_r}{r_{pj}\partial\cos\theta_{pj}}\frac{x_{pj}z_{pj}}{r_{pj}^2} \quad (R \cdot 22)$$

-continued (eqn86)

$$\frac{\partial H_r(r_{pj}, \theta_{pj})}{\partial y_p} = \frac{\partial H_r}{\partial r_{pj}}\frac{y_{pj}}{r_{pj}} - \frac{\partial H_r}{r_{pj}\partial\cos\theta_{pj}}\frac{y_{pj}z_{pj}}{r_{pj}^2} \quad (R\cdot 23)$$

$$\frac{\partial H_r(r_{pj}, \theta_{pj})}{\partial z_p} = \frac{\partial H_r}{\partial r_{pj}}\frac{z_{pj}}{r_{pj}} + \frac{\partial H_r}{r_{pj}\partial\cos\theta_{pj}}\left(1 - \frac{x_{pj}z_{pj}}{r_{pj}^2}\right) \quad (R\cdot 24)$$

$$\frac{\partial H_\theta(r_{pj}, \theta_{pj})}{\partial x_p} = \frac{\partial H_\theta}{\partial r_{pj}}\frac{x_{pj}}{r_{pj}} - \frac{\partial H_\theta}{r_{pj}\partial\cos\theta_{pj}}\frac{x_{pj}z_{pj}}{r_{pj}^2} \quad (R\cdot 25)$$

$$\frac{\partial H_\theta(r_{pj}, \theta_{pj})}{\partial z_p} = \frac{\partial H_\theta}{\partial r_{pj}}\frac{z_{pj}}{r_{pj}} - \frac{\partial H_\theta}{r_{pj}\partial\cos\theta_{pj}}\frac{y_{pj}z_{pj}}{r_{pj}^2} \quad (R\cdot 26)$$

$$\frac{\partial H_\theta(r_{pj}, \theta_{pj})}{\partial z_p} = \frac{\partial H_\theta}{\partial r_{pj}}\frac{z_{pj}}{r_{pj}} + \frac{\partial H_\theta}{\partial_{pj}\partial\cos\theta_{pj}}\left(1 - \frac{x_{pj}z_{pj}}{r_{pj}^2}\right) \quad (R\cdot 27)$$

(Calculation of Magnetization Current Created by Magnetic Moments)

<In the Case where the Magnetization is Parallel to the z Axis>

The following is the magnetic field when the magnetization is parallel to the z axis.

(eqn87)

$$\rho_{pj} = \sqrt{x_{pj}^2 + y_{pj}^2}, \cos\theta_{pj} = z_{pj}/r_{pj} \quad (R\cdot 28)$$

$$H_x(r_{pj}; m_{jz}) = \left\{H_r(r_{pj}; m_z)\frac{\rho_{pj}}{r_{pj}} + H_\theta(r_{pj}, m_z)\frac{z_{pj}}{r_{pj}}\right\}\frac{x_{pj}}{\rho_{pj}} \quad (R\cdot 29)$$

$$H_y(r_{pj}, m_{jz}) = \left\{H_r(r_{pj}; m_z)\frac{\rho_{pj}}{r_{pj}} + H_\theta(r_{pj}; m_z)\frac{z_{pj}}{r_{pj}}\right\}\frac{y_{pj}}{\rho_{pj}} \quad (R\cdot 30)$$

$$H_z(r_{pj}; m_{jz}) = H_r(r_{pj}, m_z)\frac{z_{pj}}{r_{pj}} - H_\theta(r_{pj}; m_z)\frac{\rho_{pj}}{r_{pj}} \quad (R\cdot 31)$$

The magnetization current can be expressed as follows.

$$j_m \quad (\text{eqn88})$$

The magnetic force created by the magnetization $$f(r_{pj})_m \quad (\text{eqn89})$$

is $$f_m(r_{pj}) = j_m \times B \quad (\text{eqn90})$$

At first, $$j_m(r_{pj}) \quad (\text{eqn91})$$

is obtained.

(eqn92)

$$j^x(r_{pj}, m_z) = \frac{1}{1+\frac{1}{3}\chi}\left(\partial_{y_p} H_m^z - \partial_{z_p} H_m^y\right) = \quad (R\cdot 32)$$

$$\frac{1}{1+\chi/3}\left[\frac{\partial H_r(r_{pj}; m_z)}{\partial^z y_p}\frac{z_{pj}}{r_{pj}} - \frac{\partial H_\theta(r_{pj}; m_z)}{\partial^z y_p}\frac{\rho_{pj}}{r_{pj}} - \frac{\partial H_r(r_{pj}; m_z)}{\partial^x z_p}\frac{y_{pj}}{r_{pj}} - \frac{\partial H_\theta(r_{pj}; m_z)}{\partial^x z_p}\frac{y_{pj}z_{pj}}{\rho_{pj}r_{pj}} - H_\theta\right]$$

-continued $$(j^y(r_{pj}, m_z) = \frac{1}{1+\chi/3}\left(\partial_{z_p} H_m^x - \partial_{x_p} H_m^z\right) = \quad (R\cdot 33)$$

$$\frac{1}{1+\chi/3}\left[\frac{\partial H_r(r_{pj}; m_z)}{\partial z_p}\frac{x_{pj}}{r_{pj}} + \frac{\partial H_\theta(r_{pj}; m_z)}{\partial z_p}\frac{x_{pj}z_{pj}}{\rho_{pj}r_{pj}} - \frac{\partial H_r(r_{pj}; m_z)}{\partial x_p}\frac{z_{pj}}{r_{pj}} + \frac{\partial H_\theta(r_{pj}; m_z)}{\partial x_p}\frac{\rho_{pj}}{r_{pj}} + H_\theta\right]$$

$$(j^z(r_{pj}, m_z) = \frac{1}{1+\chi/3}\left(\partial_{x_p} H_m^y - \partial_{y_p} H_m^x\right) =$$

$$\frac{1}{1+\chi/3}\left[\frac{\partial H_r(r_{pj}; m_z)}{\partial x_p}\frac{y_{pj}}{r_{pj}} + \frac{\partial H_\theta(r_{pj}; m_z)}{\partial x_p}\frac{y_{pj}z_{pj}}{\rho_{pj}r_{pj}} - \frac{\partial H_r(r_{pj}; m_z)}{\partial y_p}\frac{x_{pj}}{r_{pj}} - \frac{\partial H_\theta(r_{pj}; m_z)}{\partial y_p}\frac{x_{pj}z_{pj}}{\rho_{pj}r_{pj}}\right]$$

<In the Case where the Magnetization is Parallel to the x Axis>

The following is the magnetic field when the magnetization is parallel to the x axis.

(eqn93)

$$\rho_{pj} = \sqrt{y_{pj}^2 + z_{pj}^2}, \cos\theta_{pj} = x_{pj}/r_{pj} \quad (R\cdot 34)$$

(eqn94)

$$H_x(r_{pj}; m_{jx}) = H_r(r_{pj}; m_x)\frac{x_{pj}}{r_{pj}} - H_\theta(r_{pj}; m_x)\frac{\rho_{pj}}{r_{pj}} \quad (R\cdot 35)$$

$$H_y(r_{pj}; m_{jx}) = \left\{H_r(r_{pj}; m_x)\frac{\rho_{pj}}{r_{pj}} + H_\theta(r_{pj}; m_x)\frac{x_{pj}}{r_{pj}}\right\}\frac{y_{pj}}{\rho_{pj}} \quad (R\cdot 36)$$

$$H_z(r_{pj}; m_{jx}) = \left\{H_r(r_{pj}; m_x)\frac{\rho_{pj}}{r_{pj}} + H_\theta(r_{pj}; m_x)\frac{x_{pj}}{r_{pj}}\right\}\frac{z_{pj}}{\rho_{pj}} \quad (R\cdot 37)$$

The magnetization current $$j_{m_\chi} \quad (\text{eqn95})$$

is obtained.

(eqn96)

$$j^x(r_{pj}, m_x) = \frac{1}{1+\chi/3}\left(\partial_{y_p} H_m^z - \partial_{z_p} H_m^y\right) = \quad (R\cdot 38)$$

$$\frac{1}{1+\chi/3}\left[\frac{\partial H_r(r_{pj}; m_x)}{\partial y_p}\frac{z_{pj}}{r_{pj}} + \frac{\partial H_\theta(r_{pj}; m_x)}{\partial y_p}\frac{x_{pj}z_{pj}}{\rho_{pj}r_{pj}} - \frac{\partial H_r(r_{pj}; m_x)}{\partial z_p}\frac{y_{pj}}{r_{pj}} - \frac{\partial H_\theta(r_{pj}; m_x)}{\partial z_p}\frac{x_{pj}y_{pj}}{\rho_{pj}r_{pj}}\right]$$

$$j^y(r_{pj}, m_x) = \frac{1}{1+\chi/3}\left(\partial_{z_p} H_m^x - \partial_{x_p} H_m^z\right) = \quad (R\cdot 39)$$

$$\frac{1}{1+\chi/3}\left[\frac{\partial H_r(r_{pj}; m_x)}{\partial z_p}\frac{x_{pj}}{r_{pj}} - \frac{\partial H_\theta(r_{pj}; m_x)}{\partial z_p}\frac{\rho_{pj}}{r_{pj}} - \frac{\partial H_r(r_{pj}; m_x)}{\partial x_p}\frac{z_{pj}}{r_{pj}} - \frac{\partial H_\theta(r_{pj}; m_x)}{\partial x_p}\frac{x_{pj}z_{pj}}{\rho_{pj}r_{pj}} - H_\theta\right]$$

$$j^z(r_{pj}, m_x) = \frac{1}{1+\chi/3}(\partial_{x_p} H_m^y - \partial_{y_p} H_m^x) = \quad (R\cdot 40)$$

$$\frac{1}{1+\chi/3}\left[\frac{\partial H_r(r_{pj}; m_x)}{\partial x_p}\frac{y_{pj}}{r_{pj}} + \frac{\partial H_\theta(r_{pj}; m_x)}{\partial x_p}\frac{x_{pj}y_{pj}}{\rho_{pj}r_{pj}} - \right.$$

$$\left.\frac{\partial H_r(r_{pj}; m_x)}{\partial y_p}\frac{x_{pj}}{r_{pj}} + \frac{\partial H_\theta(r_{pj}; m_x)}{\partial y_p}\frac{\rho_{pj}}{r_{pj}} + H_\theta\right]$$

<In the Case where the Magnetization is Parallel to the y Axis>

The following is the magnetic field when the magnetization is parallel to the y axis.

(eqn97)

$$\rho_{pj} = \sqrt{x_{pj}^2 + z_{pj}^2}, \cos\theta_{pj} = y_{pj}/r_{pj} \quad (R\cdot 41)$$

$$H_x(r_{pj}, m_{jy}) = \left\{H_r(r_{pj}; m_y)\frac{\rho_{pj}}{r_{pj}} + H_\theta(r_{pj}; m_y)\frac{y_{pj}}{r_{pj}}\right\}\frac{x_{pj}}{\rho_{pj}} \quad (R\cdot 42)$$

$$H_y(r_{pj}, m_{jy}) = H_r(r_{pj}; m_y)\frac{y_{pj}}{r_{pj}} - H_\theta(r_{pj}; m_y)\frac{\rho_{pj}}{r_{pj}} \quad (R\cdot 43)$$

$$H_z(r_{pj}, m_{jy}) = \left\{H_r(r_{pj}; m_y)\frac{\rho_{pj}}{r_{pj}} + H_\theta(r_{pj}; m_y)\frac{y_{pj}}{r_{pj}}\right\}\frac{z_{pj}}{\rho_{pj}} \quad (R\cdot 44)$$

The magnetization current $$j_{m_y} \quad (\text{eqn98})$$

is obtained.

(eqn99)

$$j^x(r_{pj}, m_y) = \frac{1}{1+\chi/3}(\partial_{y_p} H_m^z - \partial_{z_p} H_m^y) = \quad (R\cdot 45)$$

$$\frac{1}{1+\chi/3}\left[\frac{\partial H_r(r_{pj}; m_y)}{\partial y_p}\frac{z_{pj}}{r_{pj}} + \frac{\partial H_\theta(r_{pj}; m_y)}{\partial y_p}\frac{y_{pj}z_{pj}}{\rho_{pj}r_{pj}} - \right.$$

$$\left.\frac{\partial H_r(r_{pj}; m_y)}{\partial z_p}\frac{y_{pj}}{r_{pj}} + \frac{\partial H_\theta(r_{pj}; m_y)}{\partial z_p}\frac{\rho_{pj}}{r_{pj}} + H_\theta\right]$$

$$(j^y(r_{pj}, m_y) = \frac{1}{1+\chi/3}(\partial_{z_p} H_m^x - \partial_{x_p} H_m^z) = \quad (R\cdot 46)$$

$$\frac{1}{1+\chi/3}\left[\frac{\partial H_r(r_{pj}; m_y)}{\partial z_p}\frac{x_{pj}}{r_{pj}} + \frac{\partial H_\theta(r_{pj}; m_y)}{\partial z_p}\frac{x_{pj}y_{pj}}{\rho_{pj}r_{pj}} - \right.$$

$$\left.\frac{\partial H_r(r_{pj}; m_y)}{\partial x_p}\frac{z_{pj}}{r_{pj}} - \frac{\partial H_\theta(r_{pj}; m_y)}{\partial x_p}\frac{y_{pj}z_{pj}}{\rho_{pj}r_{pj}}\right]$$

$$j^z(r_{pj}, m_y) = \frac{1}{1+\chi/3}(\partial_{x_p} H_m^y - \partial_{y_p} H_m^x) = \quad (R\cdot 47)$$

$$\frac{1}{1+\chi/3}\left[\frac{\partial H_r(r_{pj}; m_y)}{\partial x_p}\frac{y_{pj}}{r_{pj}} - \frac{\partial H_\theta(r_{pj}; m_y)}{\partial x_p}\frac{\rho_{pj}}{r_{pj}} - \right.$$

$$\left.\frac{\partial H_r(r_{pj}; m_y)}{\partial y_p}\frac{x_{pj}}{r_{pj}} - \frac{\partial H_\theta(r_{pj}; m_y)}{\partial y_p}\frac{x_{pj}y_{pj}}{\rho_{pj}r_{pj}} - H_\theta\right]$$

(Calculation of Eddy Current Created by Induced Magnetic Field)

According to S-3, the induced magnetic field is given by the following.

(eqn100)

$$H_{ind}(x_p) = -\sum_j \sigma_j \dot{B}_j G(r_{pj}) \quad (R\cdot 48)$$

$$G(r_{pj}) = \begin{cases} \sigma_j \dfrac{a^3}{3r_{pj}} & r_{pj} > a \\ \sigma_j\left(\dfrac{a^2}{2} - \dfrac{r_{pj}^2}{6}\right) & r_{pj} < a \end{cases} \quad (R\cdot 49)$$

Here, G (r) is a Green function (a propagation function). The eddy current is given by the following.

(eqn101)

$$j_{eddy}(r_p) = \frac{1}{1+\chi/3}\nabla \times H_{ind}(x_p) \quad (R\cdot 50)$$

$$= -\frac{1}{1+\chi/3}\sum_j \nabla_p G(r_{pj}) \times \dot{B}_j \quad (R\cdot 51)$$

$$\nabla G(r_{pj}) = \begin{cases} -\sigma_j \dfrac{a^3}{3r_{pj}^2}\dfrac{x_p - x_j}{r_{pj}} & r_{pj} > a \\ -\sigma_j \dfrac{r_{pj}}{3}\dfrac{x_p - x_j}{r_{pj}} & r_{pj} < a \end{cases} \quad (R\cdot 52)$$

(Calculation of the Force Applied on a Particle)

By adding $m_x$, $m_y$, $m_z$ and the contribution from the eddy current, the total current can be obtained as follows.

(eqn102)

$$j(x_p) = \sum_{j\neq p}\{j(r_{pj}, m_x) + j(r_{pj}, m_y) + j(r_{pj}, m_z)\} + j_{eddy}(r_p) \quad (R\cdot 53)$$

The force applied on a particle at a coordinate $$x_p \quad (\text{eqn103})$$

is given by the following.

(eqn104)

$$f(x_p) = j(x_p) \times B(x_p)\delta V_p - \nabla_p \Phi(r_p) \quad (R\cdot 54)$$

In the end, it is necessary to add a term derived from the derivative of $$L_{EM} \quad (\text{eqn105})$$

This is a virtual force created by an error of the magnetic field $$H_{oi} - H_o(x_i), \quad (\text{eqn106})$$

and the total energy of the motion and the magnetic field is conserved.

(eqn107)

$$f(x_p) = j(x_p)\times B(x_p)\delta V_p - \nabla_p \Phi(r_p) + \quad (R\cdot 55)$$

$$\mu_o[\{(H_{op} - H_o(x_p))\cdot \nabla\}H_o(x_p) - j(x_p)\times\{H_{op} - H_o(x_p)\}]\delta V_p$$

The embodiment describes the case where both the position and the velocity of a particle are calculated in the numerical operation unit 120. However, the present invention is not limited to this. For example, in a method of numerical analysis, such as the Verlet method, the position of a particle is directly calculated from the force applied on the particle in the calculation of the position of the particle and the velocity of the particle does not have to be explicitly calculated. The concept according to the present embodiment can be applied to such a method.

It should be understood that the invention is not limited to the above-described embodiment, but may be modified into various forms on the basis of the spirit of the invention. Additionally, the modifications are included in the scope of the invention.

Priority is claimed to Japanese Patent Application No. 2012-046390, filed Mar. 2, 2012, the entire content of which is incorporated herein by reference.

What is claimed is:

1. An analyzer, comprising:
   a magnetic moment association unit operative to associate a particle in a particle system defined in a virtual space with a magnetic moment;
   a numerical operation unit operative to perform numerical operation according to a governing equation that governs a motion of each particle in the particle system and that is described by using the spherical symmetry of each particle, the particle system including the particle which is associated with the magnetic moment by the magnetic moment association unit; and
   a magnetic physical quantity calculation unit operative to calculate a magnetic physical quantity with regard to the particle system using the results of the numerical operation performed by the numerical operation unit;
      wherein the particle system defined in a virtual space is obtained by discretizing a magnetic continuum to be analyzed by particles; and
      wherein the numerical operation unit is operative to perform the numerical operation according to the governing equation by using a demagnetizing coefficient of a spherical magnetic body.

2. The analyzer according to claim 1, wherein the particle system is a particle system which is renormalized using a Renormalized Molecular Dynamics Method.

3. The analyzer according to claim 1, wherein the governing equation in the numerical operation unit has a term dependent on the magnetic moment.

4. The analyzer according to claim 1, wherein the magnetic physical quantity calculation unit is operative to calculate a magnetic field or a magnetic flux density created by the particle system.

5. The analyzer according to claim 1, wherein the numerical operation unit operative to perform the numerical operation according to the governing equation that is described by using an exact solution of a magnetic physical quantity with regard to the spherical magnetic body.

6. The analyzer according to claim 1, wherein the magnetic physical quantity comprises a magnetic field of an electrical appliance.

7. The analyzer according to claim 6, wherein the electrical appliance is a motor.

8. A non-transitory computer readable recording medium having recorded thereon a computer program, the computer program causing a computer to perform, when executed, functions comprising:
   associating a particle in a particle system defined in a virtual space with a magnetic moment;
   performing numerical operation according to a governing equation that governs a motion of each particle in the particle system and that is described by using the spherical symmetry of each particle, the particle system including the particle which is associated with the magnetic moment; and
   calculating a magnetic physical quantity with regard to the particle system using the results of the numerical operation;
      wherein the particle system defined in a virtual space is obtained by discretizing a magnetic continuum to be analyzed by particles; and
      wherein the numerical operation according to the governing equation is performed by using a demagnetizing coefficient of spherical magnetic body.

* * * * *